US012701765B2

(12) United States Patent
More et al.

(10) Patent No.: US 12,701,765 B2
(45) Date of Patent: Aug. 4, 2026

(54) SEMICONDUCTOR DEVICE AND METHODS OF FORMATION

(71) Applicant: Taiwan Semiconductor Manufacturing Company, Ltd., Hsinchu (TW)

(72) Inventors: Shahaji B. More, Hsinchu City (TW); Cheng-Han Lee, New Taipei City (TW); Pei-Shan Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 750 days.

(21) Appl. No.: 17/651,110

(22) Filed: Feb. 15, 2022

(65) Prior Publication Data

US 2023/0012054 A1     Jan. 12, 2023

Related U.S. Application Data

(60) Provisional application No. 63/220,209, filed on Jul. 9, 2021.

(51) Int. Cl.
H10D 64/01          (2025.01)
H10D 30/01          (2025.01)
(Continued)

(52) U.S. Cl.
CPC ......... H10D 64/018 (2025.01); H10D 30/031 (2025.01); H10D 62/116 (2025.01); H10D 62/151 (2025.01); *H10D 30/6735* (2025.01); *H10D 30/6757* (2025.01); *H10D 62/118* (2025.01)

(58) Field of Classification Search
None
See application file for complete search history.

(56) References Cited

U.S. PATENT DOCUMENTS 10,170,638 B1 * 1/2019 Reznicek ............. H10D 62/151
10,424,639 B1 * 9/2019 Miao .................. H10D 30/6735
(Continued)

FOREIGN PATENT DOCUMENTS

CN          111415990 A       7/2020
CN          111725315 A       9/2020
(Continued)

*Primary Examiner* — Brent A. Fairbanks
*Assistant Examiner* — Derek L Nielsen
(74) *Attorney, Agent, or Firm* — Harrity & Harrity, LLP

(57)          ABSTRACT

Some implementations described herein provide a method. The method includes forming, in a nanostructure transistor device, a recessed portion for a source/drain region of the nanostructure transistor device. The method also includes forming an inner spacer on a bottom of the recessed portion and on sidewalls of the recessed portion. The method further includes etching the inner spacer such that the inner spacer is removed from the bottom and from first portions of the sidewalls, and such that the inner spacer remains on second portions of the sidewalls. The method additionally includes forming, after etching the inner spacer, a buffer layer over a substrate of the nanostructure transistor device at the bottom of the recessed portion. The method further includes forming the source/drain region over the buffer layer in the recessed portion.

20 Claims, 29 Drawing Sheets

(51) Int. Cl.
    *H10D 30/67*        (2025.01)
    *H10D 62/10*        (2025.01)
    *H10D 62/13*        (2025.01)

(56)         References Cited

U.S. PATENT DOCUMENTS

| | | | |
|---|---|---|---|
| 10,529,830 B2 | 1/2020 | Tapily et al. | |
| 11,031,502 B2 | 6/2021 | Jang et al. | |
| 11,094,800 B2 | 8/2021 | Son et al. | |
| 11,195,911 B2 * | 12/2021 | Xie | H10D 62/116 |
| 11,211,457 B2 * | 12/2021 | Choi | H10D 62/152 |
| 11,581,426 B2 | 2/2023 | Cheng et al. | |
| 2017/0250250 A1 | 8/2017 | Bentley et al. | |
| 2017/0317169 A1 | 11/2017 | Bentley et al. | |
| 2020/0044023 A1 * | 2/2020 | Reznicek | H10D 62/121 |
| 2020/0365692 A1 * | 11/2020 | Jung | H10D 30/62 |
| 2021/0028068 A1 | 1/2021 | Dentoni et al. | |

FOREIGN PATENT DOCUMENTS

| | | |
|---|---|---|
| TW | 201818476 A | 5/2018 |
| TW | 202008512 A | 2/2020 |

* cited by examiner

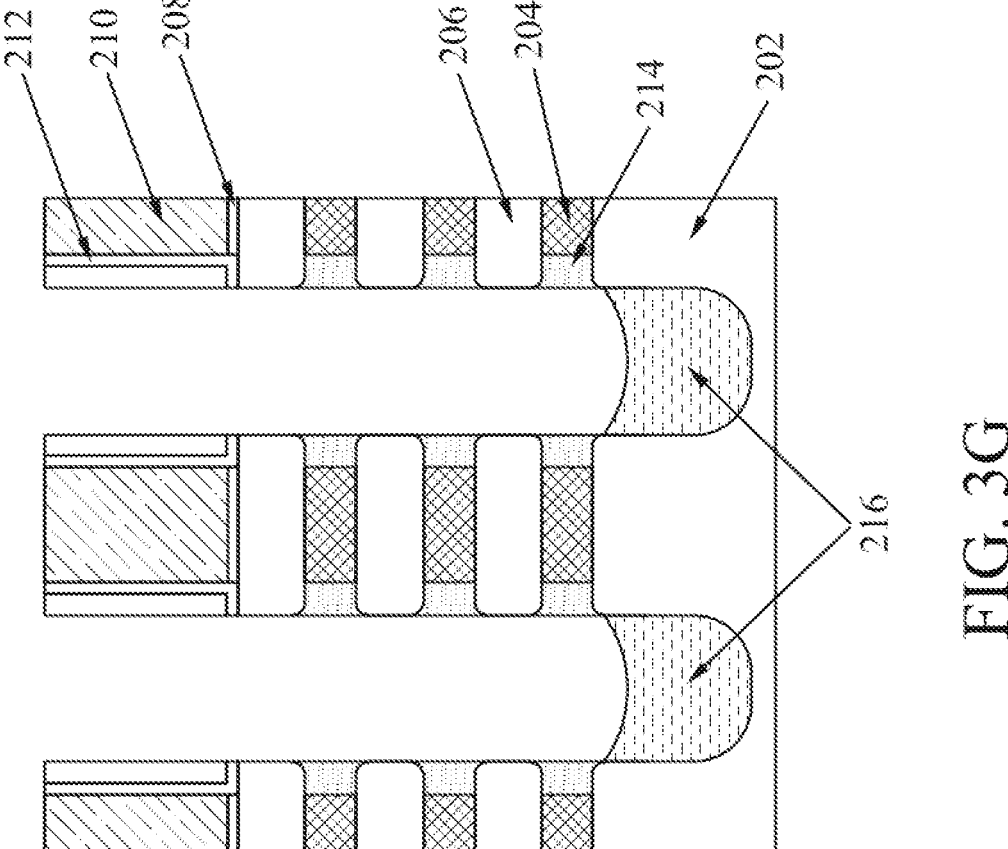
FIG. 3G

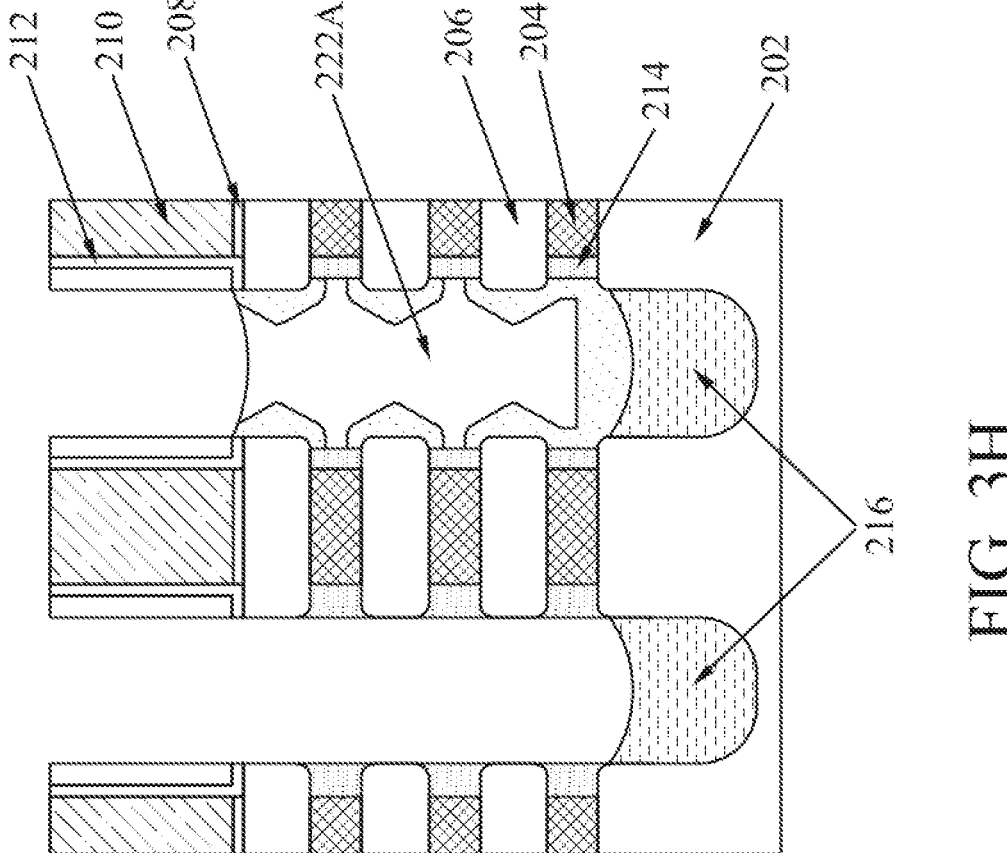
FIG. 3H

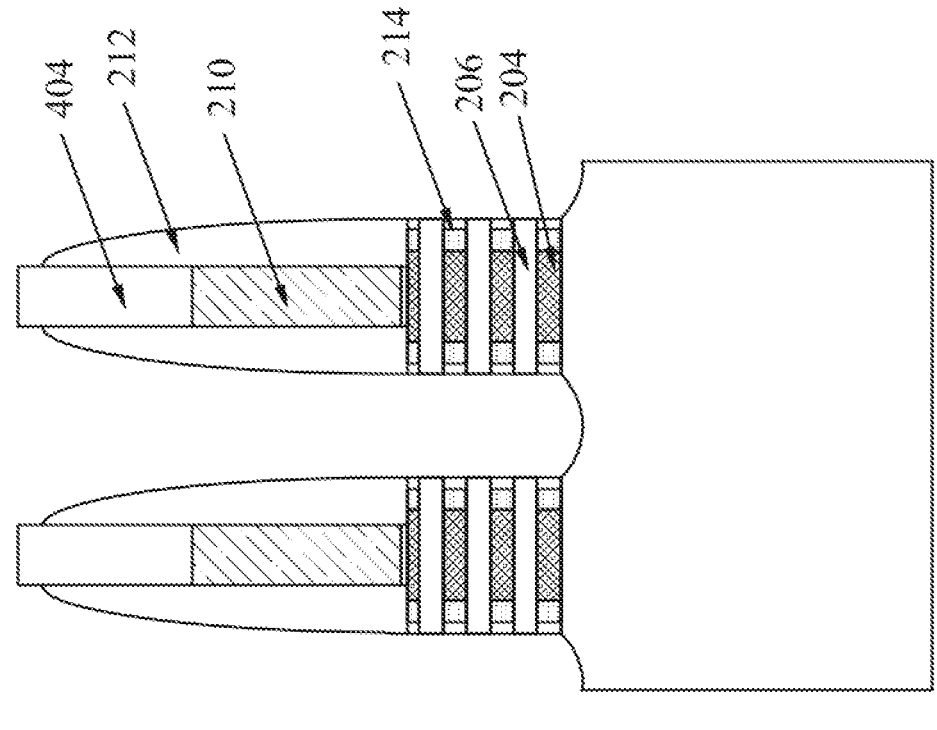
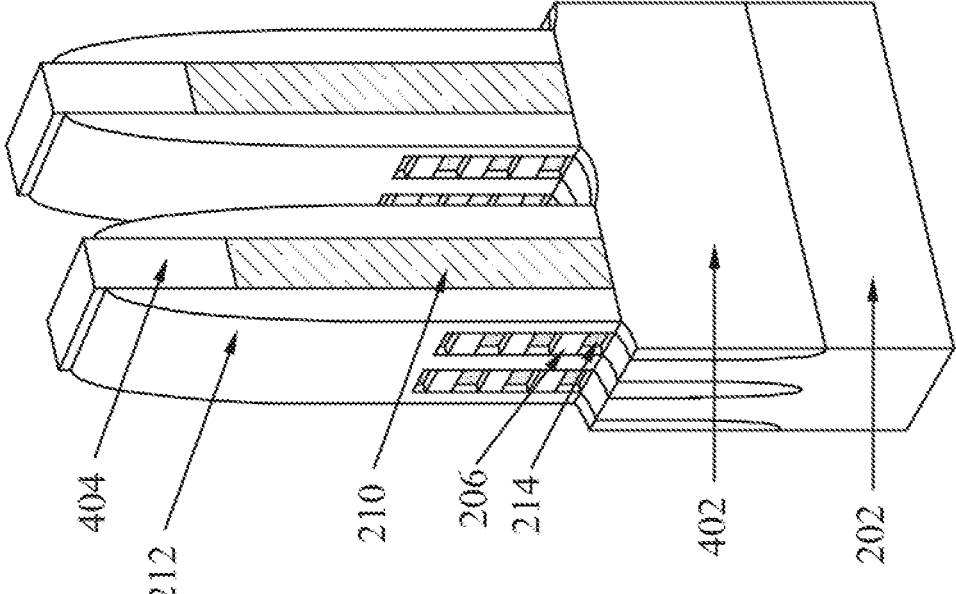
FIG. 4F

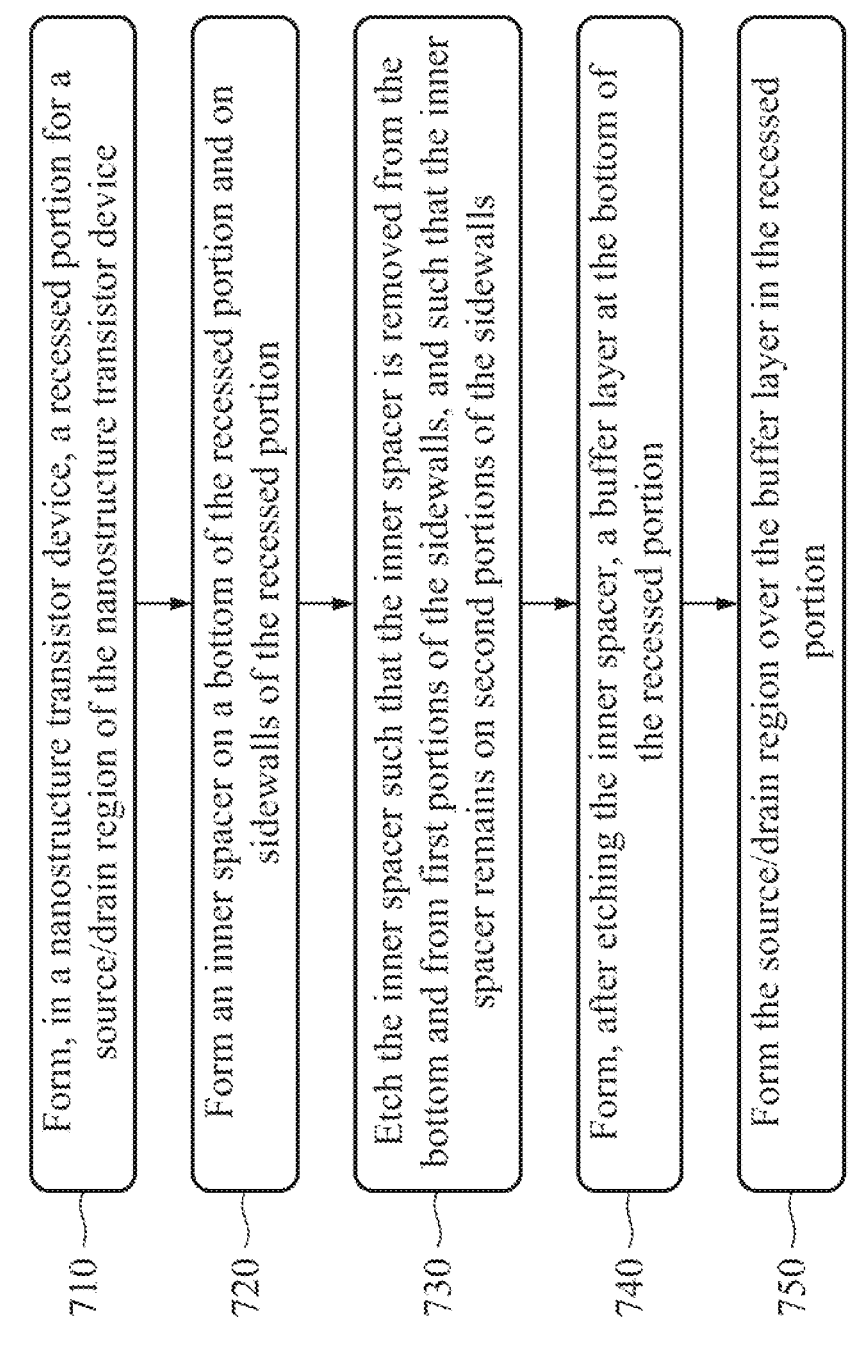

700

710  Form, in a nanostructure transistor device, a recessed portion for a source/drain region of the nanostructure transistor device 720  Form an inner spacer on a bottom of the recessed portion and on sidewalls of the recessed portion 730  Etch the inner spacer such that the inner spacer is removed from the bottom and from first portions of the sidewalls, and such that the inner spacer remains on second portions of the sidewalls 740  Form, after etching the inner spacer, a buffer layer at the bottom of the recessed portion 750  Form the source/drain region over the buffer layer in the recessed portion

FIG. 7

SEMICONDUCTOR DEVICE AND METHODS OF FORMATION

CROSS-REFERENCE TO RELATED APPLICATION

This patent application claims priority to U.S. Provisional Patent Application No. 63/220,209, filed on Jul. 9, 2021, and entitled "SEMICONDUCTOR DEVICE AND METHODS OF FORMATION." The disclosure of the prior application is considered part of and is incorporated by reference into this patent application.

BACKGROUND

Fin-based field effect transistor (FinFET) devices are three-dimensional structures that have a conductive channel region that includes a fin of semiconductor material that rises above a substrate as a three-dimensional structure. A gate structure, configured to control a flow of charge carriers within the conductive channel region, wraps around the fin of semiconductor material. For example, in a gate-all-around (GAA) FinFET structure, the gate structure wraps around all sides of a fin of semiconductor material, thereby forming conductive channel regions on all sides of the fin. A commonly used type of FET is a metal-oxide-semiconductor field-effect transistor (MOSFET). A MOSFET can be used, for example, as a switch for an electrical signal (e.g., a radio frequency (RF) switch) or as an amplifier for an electrical signal (e.g., a low-noise amplifier (LNA)), among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3I are diagrams of an example implementation described herein.

FIGS. 4A-4H are diagrams of an example implementation described herein.

FIGS. 7 and 8 are flowcharts of example processes relating to forming a semiconductor device described herein.

DETAILED DESCRIPTION

Figure 1:
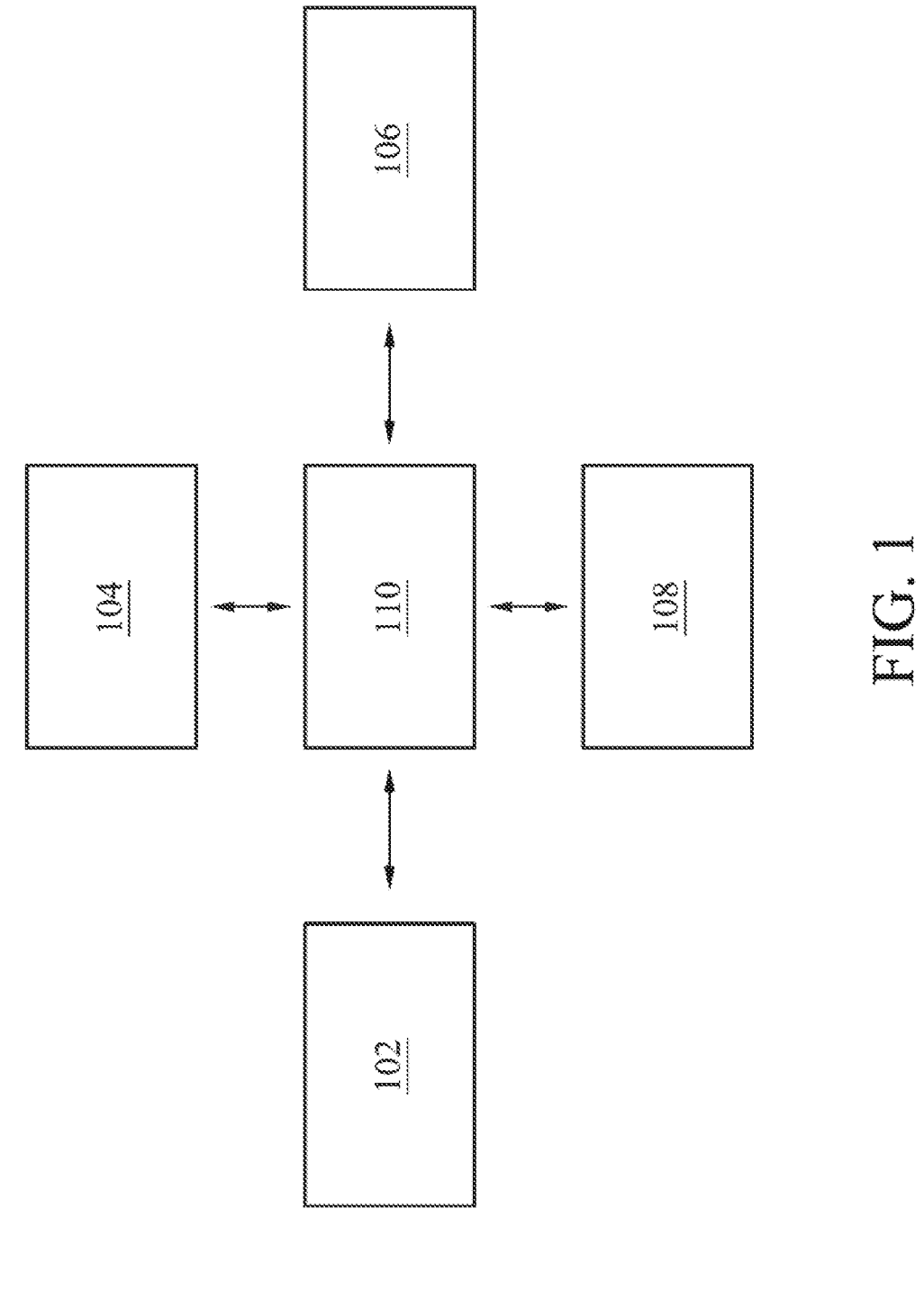
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, voids may occur during the formation of a source/drain region of a nanostructure transistor. Void formation may occur, for example, during and/or after an L1 layer process (e.g., a SiGe:B (boron) based L1 layer process) in which the L1 layer is formed directly on a recessed strained source/drain (SSD) region. Due to the growth rate difference between the silicon channels and the silicon nitride (SiN) spacer regions, the voids may occur near the spacer regions. This may result in the inability to grow SiGe:B based L1 layer that includes a high concentration of germanium (Ge) on deep inner spacers.

Some implementations described herein provide nanostructure transistors such as GAA devices and methods of formation that provide void-free (or near void-free) source/drain regions. In some implementations, a thin boron-doped (B-doped) layer is formed only around a silicon (Si) channel of a nanostructure transistor and not on a spacer region (e.g., a silicon nitride (SiN) spacer region) of the nanostructure transistor. The thin B-doped layer may control the growth rate of an L1 SiGe layer and reduce, minimize, and/or prevent the formation of defects and/or B file-up in subsequent processes associated with the nanostructure transistor.

In some implementations, a doped interface Si layer is deposited prior to high-concentration Ge (or Ge precursor) layer in source/drain recesses of a nanostructure transistor with a controlled raised height before the epitaxial formation process of the source/drain regions. In this way, an SiGe:B layer reaction does not form voids (or void formation is reduced or minimized) due to abnormal growth on a deep inner spacer of the source/drain recesses for formation of the source/drain regions. The sequential deposition method of the L1 SiGe:B layer including non-Ge and with Ge of SiB layer is described herein. The source/drain regions with desired dopants and with different raised height and depth for device performance may also be formed. In this way, void defects may be reduced or prevented by depositing SiB before depositing a highly doped Ge L1 layer. This may reduce or prevent short channel effects by depositing the un-doped Si or SiGe layer to modify the source/drain recesses, so that defects may be controlled (or prevented), which may increase the device performance of a nanostructure transistor.

In some implementations, a method, includes forming, in a nanostructure transistor device, a recess for a source/drain region of the nanostructure transistor device. The method includes forming an inner spacer on a bottom of the recess and on sidewalls of the recess. The method includes etching the inner spacer such that the inner spacer is removed from the bottom and from first portions of the sidewalls, and such that the inner spacer remains on second portions of the sidewalls. The method includes forming, after etching the inner spacer, a buffer layer over a substrate of the nano-structure transistor device at the bottom of the recess. The method includes forming the source/drain region over the buffer layer in the recess.

FIG. 1 is a diagram of an example environment 100 in which systems and/or methods described herein may be implemented. As shown in FIG. 1, environment 100 may include a plurality of semiconductor processing tools 102-108 and a wafer/die transport tool 110. The plurality of semiconductor processing tools 102-108 may include a deposition tool 102, an etching tool 104, a planarization tool 106, an ion implantation tool 108, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that is capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The etching tool 104 is a semiconductor processing tool that is capable of etching various types of materials of a substrate, wafer, or semiconductor device. For example, the etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of the substrate using a sputtering technique, a plasma-assisted etch technique (e.g., a plasma sputtering technique or another type of technique involving the use of an ionized gas to isotropically or directionally etch the one or more portions), or another type of dry etching technique.

The planarization tool 106 is a semiconductor processing tool that is capable of polishing or planarizing various layers of a wafer or semiconductor device. For example, the planarization tool 106 may include a chemical mechanical planarization (CMP) tool and/or another type of planarization tool that polishes or planarizes a layer or surface of deposited or plated material. The planarization tool 106 may polish or planarize a surface of a semiconductor device with a combination of chemical and mechanical forces (e.g., chemical etching and free abrasive polishing). The planarization tool 106 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The ion implantation tool 108 is a semiconductor processing tool that is capable of implanting ions into a substrate such as a semiconductor wafer. The ion implantation tool 108 generates ions in an arc chamber from a source material such as a gas or a solid. The source material is provided into the arc chamber, and an arc voltage is discharged between a cathode and an electrode to produce a plasma containing ions of the source material. One or more extraction electrodes are used to extract the ions from the plasma in the arc chamber and accelerate the ions to form an ion beam. The ion beam may be directed toward the substrate such that the ions are implanted below the surface of the substrate to dope the substrate.

Wafer/die transport tool 110 includes a mobile robot, a robot arm, a tram or rail car, an overhead hoist transfer (OHT) vehicle, an automated material handling system (AMES), and/or another type of tool that is used to transport wafers and/or dies between semiconductor processing tools 102-108 and/or to and from other locations such as a wafer rack, a storage room, or another location. In some implementations, wafer/die transport tool 110 may be a programmed tool to travel a particular path and/or may operate semi-autonomously or autonomously.

FIGS. 2A-2F are diagrams of an example semiconductor device 200 (also referred to as a nanostructure transistor device 200) described herein. Semiconductor device 200 may be manufactured using an example process as shown in FIGS. 2A-2F. The example process may include one or more other operations (e.g., lithography operations, operations performed on different portions of an electronic device that includes the semiconductor device 200). The operations shown in the example process may be performed in a different order from the order shown in FIGS. 2A-2F. The semiconductor device 200 may include one or more additional devices, structures, and/or layers not shown in FIGS. 2A-2F. For example, the semiconductor device 200 may include additional layers and/or dies formed on layers above and/or below the portion of the semiconductor device 200 shown in FIGS. 2A-2F. Additionally, or alternatively, one or more additional semiconductor structures and/or semiconductor devices may be formed in a same layer of an electronic device that includes the semiconductor device, with a lateral displacement, as the semiconductor device 200 shown in FIGS. 2A-2F. The semiconductor device 200 may be used in a FinFET structure having a narrow critical dimension (e.g., a lateral dimension as shown in FIGS. 2A-2F), such as an N3 FinFET structure and/or a GAA FET structure.

Figure 2A:
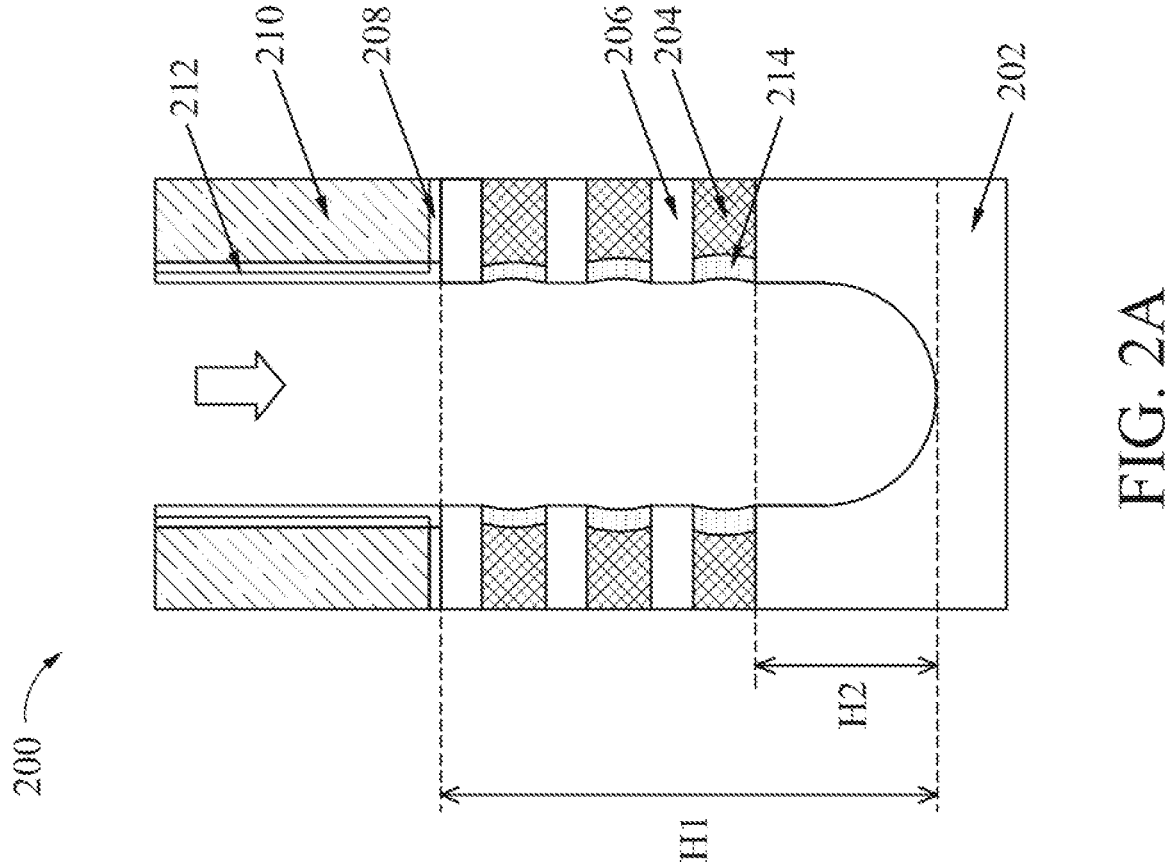
FIGS. 2A-2I are diagrams of an example implementation described herein.

As shown in FIG. 2A, the semiconductor device 200 includes a substrate 202. The substrate 202 may include a semiconductor die substrate, a semiconductor wafer, or another type of substrate in and/or on which semiconductor devices may be formed. In some implementations, the substrate 202 is formed of silicon (Si), a material including silicon, a III-V compound semiconductor material such as gallium arsenide (GaAs), a silicon on insulator (SOI), or another type of semiconductor material.

The semiconductor device 200 includes a fin stack having alternating layers of silicon-based materials (e.g., nanosheets). The alternating layers of silicon-based materials may include a set of silicon germanium (SiGe) layers 204 (also referred to as silicon germanium nanostructures 204) and a set of silicon layers 206 (also referred to as silicon nanostructures 206). The semiconductor device 200 may include an oxide layer 208 (e.g., a gate oxide) disposed on a top surface of the fin stack (e.g., on a top surface of a top-most silicon layer 206).

The semiconductor device 200 may further include a sacrificial structure 210 (e.g., a polysilicon gate structure, a dielectric structure, or a hard mask) disposed on a top surface of the oxide layer 208. The sacrificial structure 210 may be replaced by a metal gate structure in a later operation of a processes of manufacturing the semiconductor device 200. In some implementations, the semiconductor device 200 includes a fin sidewall (FSW) spacer 212 disposed on sidewalls of the sacrificial structure 210.

The semiconductor device 200 includes a recessed portion for a source/drain region of the semiconductor device 200 (e.g., a strained source/drain) disposed between two fin stacks. The two fin stacks may be part of a plurality of fin structures that include the two fin stacks and portions of the substrate 202. In some implementations, one or more semiconductor processing tools (e.g., etching tool 104) etch the set of silicon germanium layers 204, the set of silicon layers 206, and a portion of the substrate 202 to form the recessed portion. The one or more semiconductor processing tools (e.g., etching tool 104) may use a cyclic photo-etch process to form the recessed portion. A height H1 from a bottom of the recessed portion to a top surface of the fin stack (e.g., a nanosheet fin height) may be in a range of approximately 30 nanometers (nm) to approximately 100 nm. In this way, the height H1 may be tall enough to have a sufficient number of nanosheets to operate and/or may be short enough to reduce or avoid fin stack bending. A height H2 from the bottom of the recessed portion to a bottom surface of the fin stack (e.g., below an associated trench isolation structure not shown in FIG. 2A) may be in a range of approximately 10 nm to approximately 30 nm. In this way, the height H2 may be tall enough to reduce or eliminate a short channel effect of the semiconductor device 200 and/or may be short enough to avoid unnecessary costs of materials to fill the recessed portion.

Figure 3A:
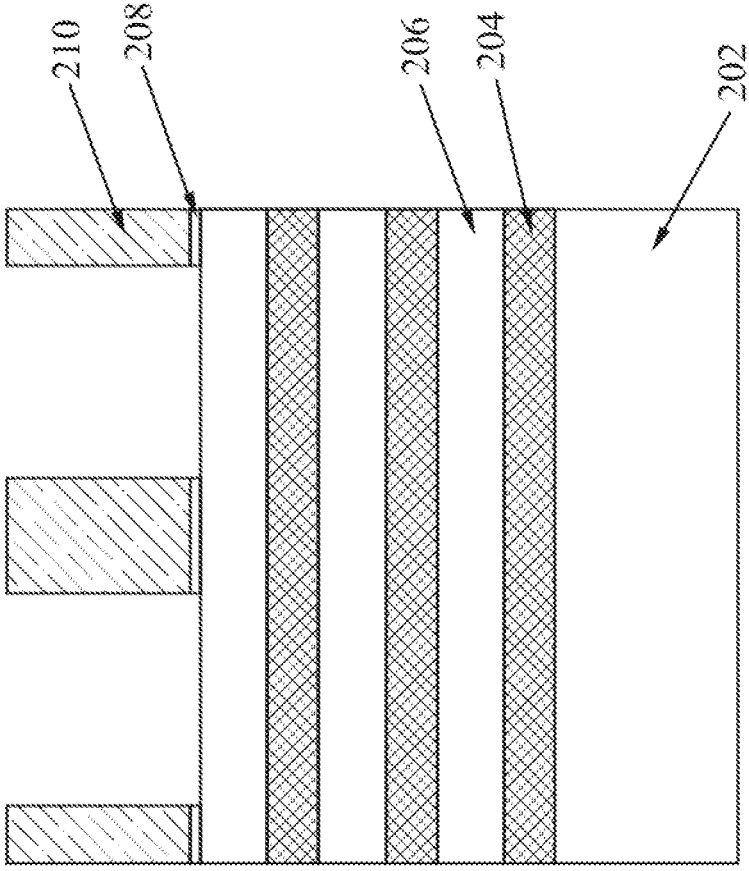
Figure 3B:
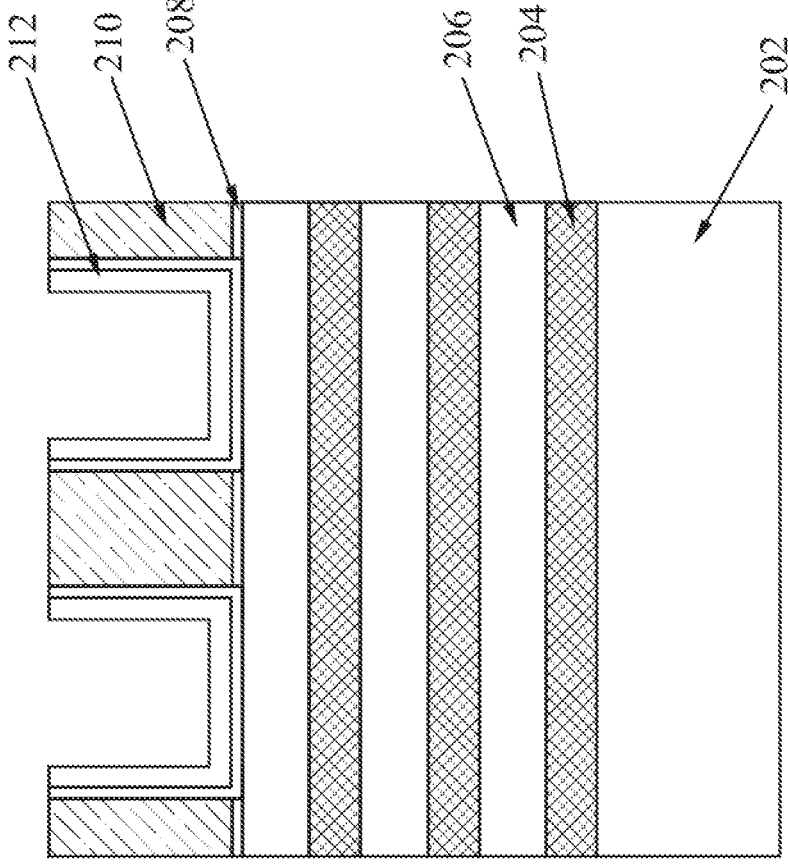
Figure 3C:
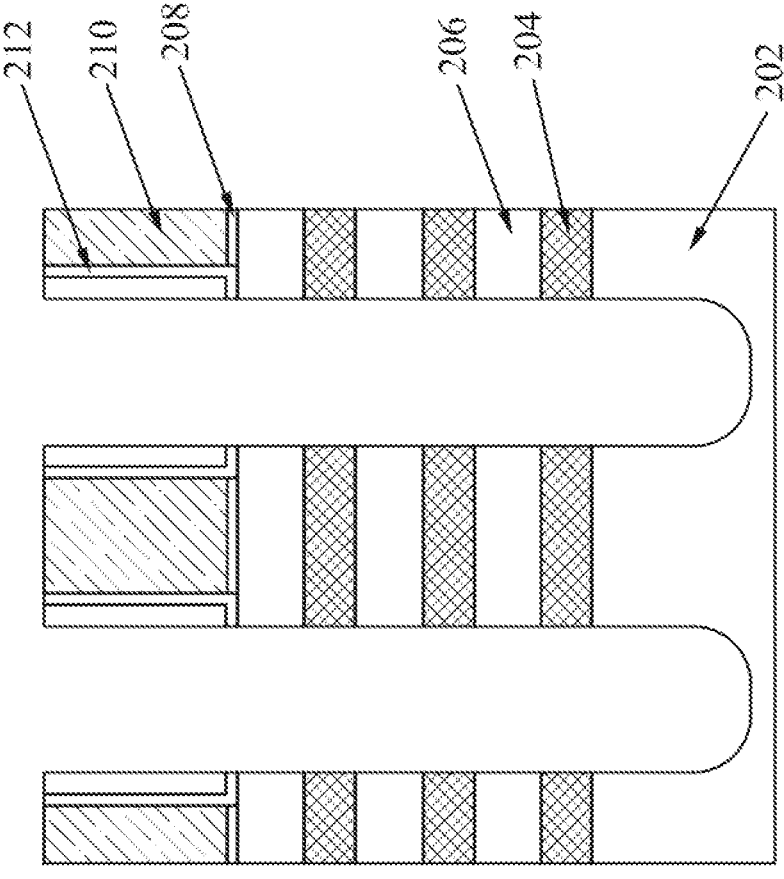
Figure 3D:
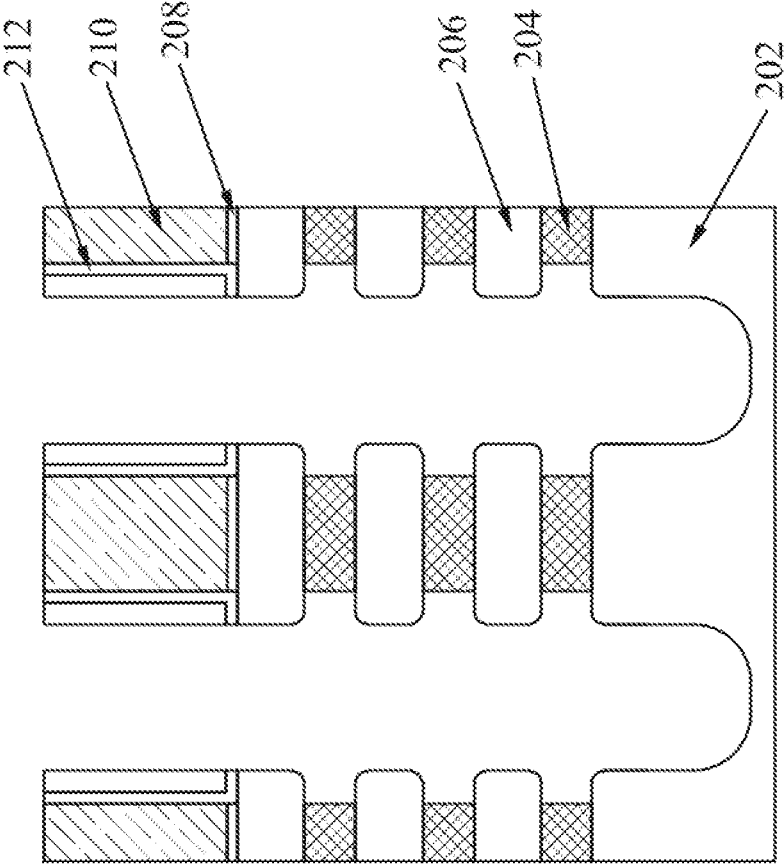

After initially forming the recessed portion, the one or more semiconductor processing tools may etch away portions of the set of silicon germanium layers 204 that are exposed to the recessed portion (e.g., as shown in FIG. 3D) and/or may etch away silicon nitride and/or silicon carbon oxynitride (SiCON) fin sidewall materials. For example, the one or more semiconductor processing tools may provide methane (CH4), trifluoromethane (CHF3), oxygen gas (O2), hydrogen bromide (HBr), silicon tetrachloride (SiCl4), sulfur dioxide (SO2), Sulfur hexafluoride (SF6), helium gas (He), and/or hydrogen gas (H2), among other examples as a gas-based etchant. The gas-based etchant may be applied at a pressure in a range of approximately 5 milliTors (mTors) to approximately 100 mTors and/or at a temperature in a range of approximately 25 degrees Celsius and approximately 150 degrees Celsius.

Figure 3E:
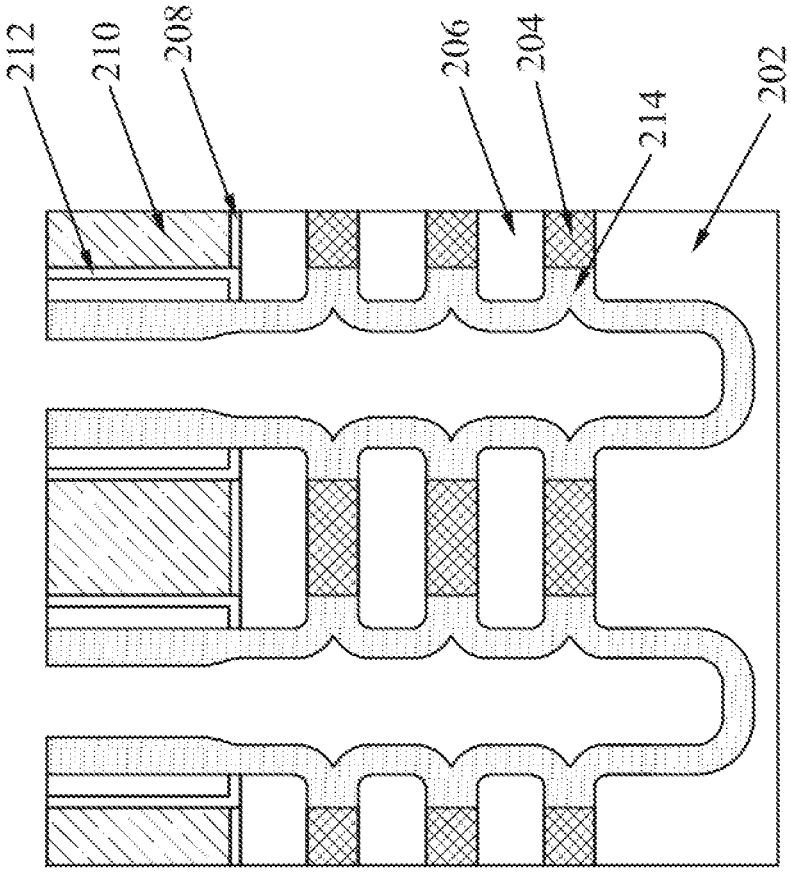
Figure 3F:
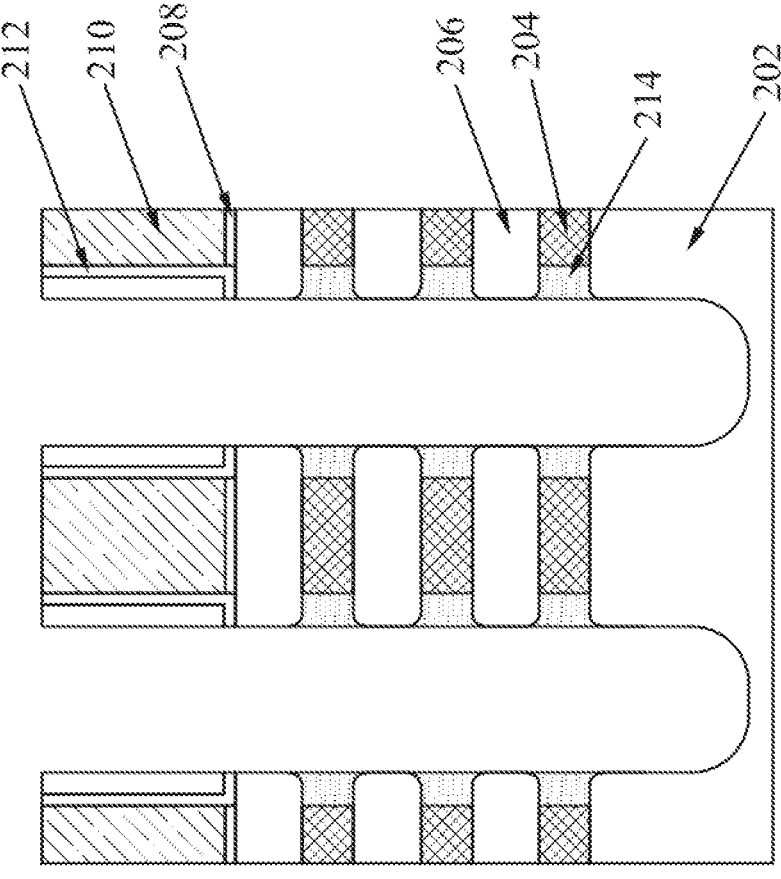

After etching away the portions of the set of silicon germanium layers 204 that are exposed the recessed portion, the one or more semiconductor processing tools may form inner spacers 214 between the silicon germanium layers 204 and the recessed portion to insulate the silicon germanium layers 204 from the recessed portion. The one or more semiconductor processing tools may form the inner spacers 214 using one or more operations (e.g., as shown in FIGS. 3E and 3F).

Figure 2B:
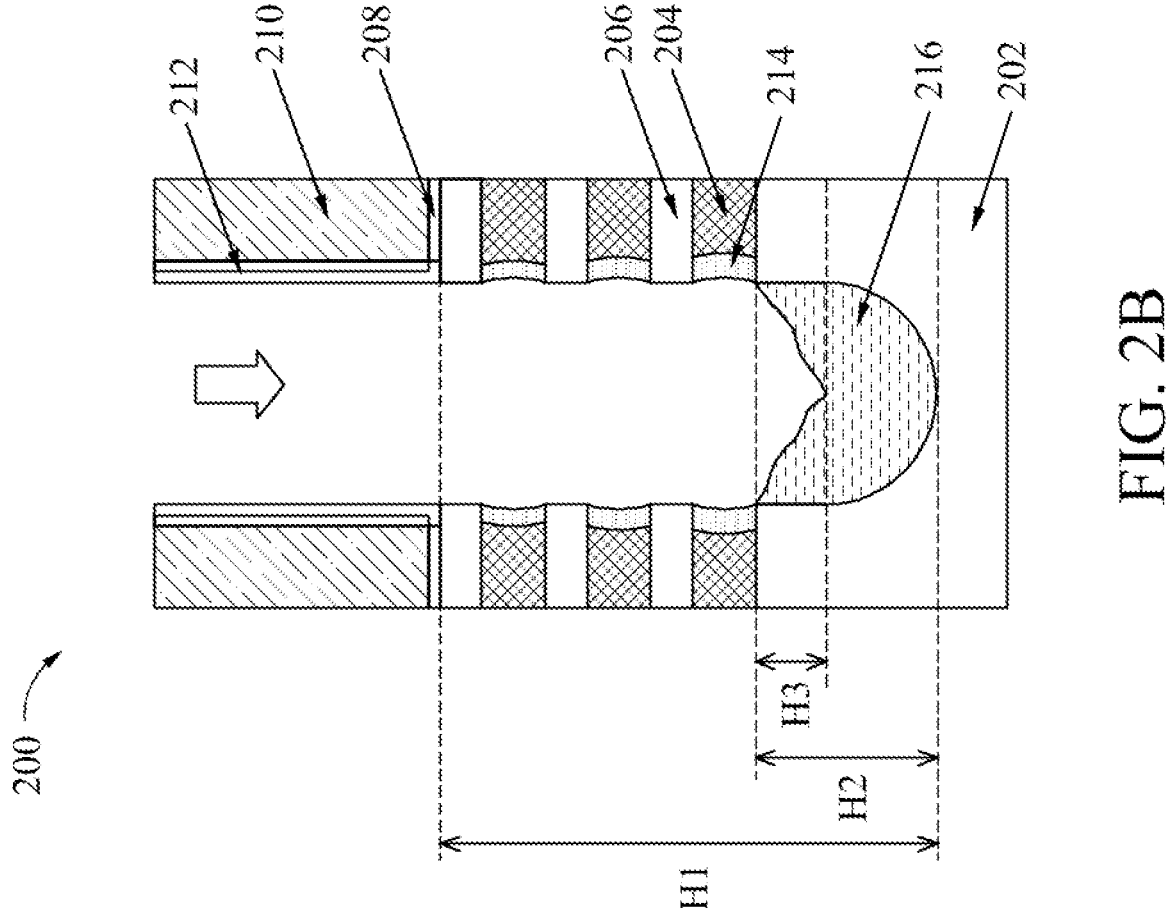

As shown in FIG. 2B, the semiconductor device 200 may include a buffer layer 216 (also referred to as L0 of the source/drain region) in the recessed portion. In some implementations, the one or more tools (e.g., deposition tool 102) deposit material of the buffer layer 216 on the bottom of the recessed portion. The one or more semiconductor processing tools may deposit the material of the buffer layer 216 using an ex-situ deposition operation (e.g., based on first breaking at least a partial vacuum that had been in place during one or more etching operations described above). The one or more semiconductor processing tools may deposit material of the buffer layer 216 using a selective growth operation. For example, the one or more semiconductor processing tools may provide hydrochloric acid, dichlorosilane, and/or silane in a chamber that is different from a chamber used during the one or more etching operations described above. The one or more semiconductor processing tools may provide the hydrochloric acid, the dichlorosilane, and/or the silane in the chamber under a pressure that is in a range of approximately 10 torr to approximately 100 torr and/or at a temperature that is in a range of approximately 600 degrees Celsius to a range of approximately 750 degrees Celsius. In some implementations, the buffer layer material is not deposited on sidewalls of the fin stacks based on performing a post etch operation, for example, using an in-situ dry etch (e.g., at an amount in a range of approximately 200 standard cubic centimeters per minute (sccm) to approximately 500 sccm) using hydrochloric acid in a hydrogen gas environment.

As shown in FIG. 2B, the buffer layer 216 may be formed in a shape in which a top surface at a center of the buffer layer 216 is lower than a top surface at a side of the buffer layer 216 (e.g., at the sidewall of the fin stacks). In some implementations, this is based on rate differences between the deposition of silicon (e.g., silane and/or dichlorosilane) and the etching of the silicon (e.g., using hydrochloric acid and/or dichlorosilane). A height (H3) of a difference between the top surface at the center of buffer layer 216 and the top surface at the side of the buffer layer 216 may be in a range of approximately 0 nm to approximately 10 nm. The top surface at the side of the buffer layer 216 may be at a bottom surface of a bottom-most nanosheet of the fin stack and/or at a top surface of a trench isolation structure of the semiconductor device 200.

In some implementations, the buffer layer includes undoped silicon, undoped silicon germanium, or an undoped gradient silicon germanium with a concentration of germanium in a range of approximately 0% to approximately 25% from a bottom surface of the buffer layer 216 to a top surface of the buffer layer 216 (e.g., with a lowest concentration at the bottom surface and with a highest concentration at a top surface). In some implementations, an undoped layer may reduce or avoid a short channel effect based on depositing the undoped layer (e.g., silicon or silicon germanium) to modify the source/drain recesses. In this was the short channel effect may be controlled and device performance may improve.

Figure 2C:
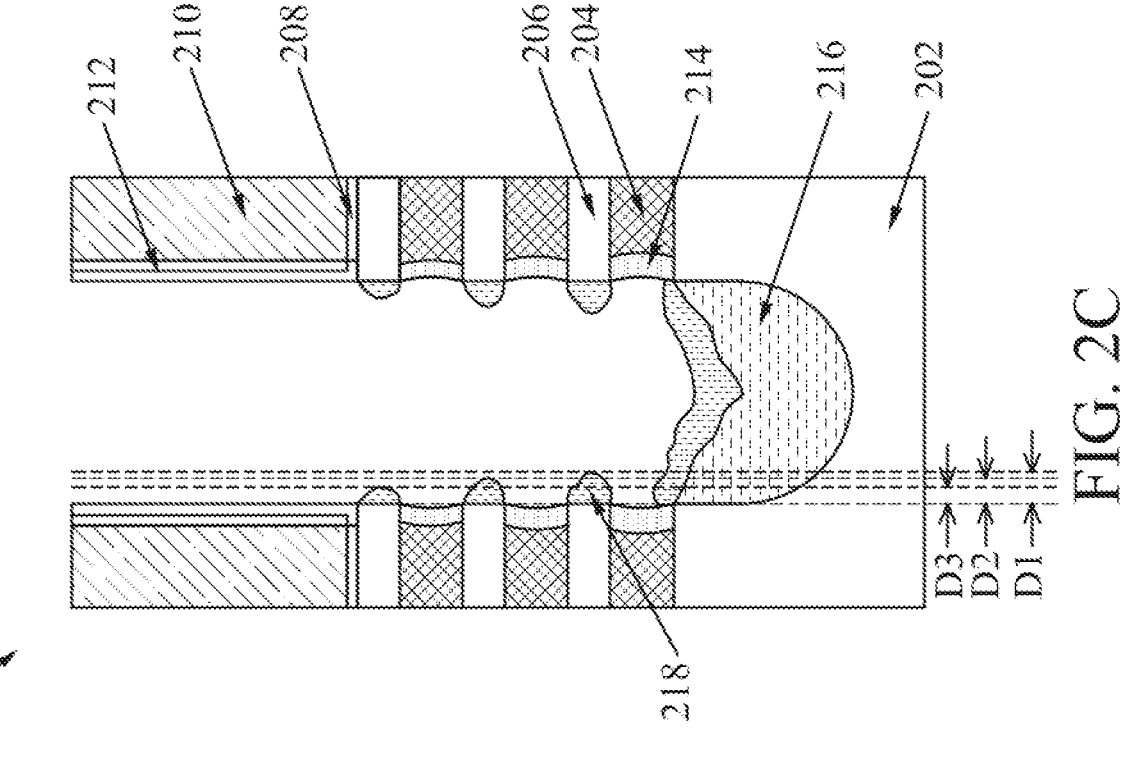

As shown in FIG. 2C, the semiconductor device 200 may include boron doped silicon regions 218 (also referred to as a first source/drain material 218, L1-1 218 of the source/drain region, or a first layer 218 of the source/drain region) within the recessed portion. In some implementations, one or more semiconductor processing tools (e.g., deposition tool 102) may deposit the boron doped silicon regions 218 within the recessed portion using, for example, selective etching growth. For example, the one or more semiconductor processing tools may apply precursor gases including silane, dichlorosilane, diborane(6) (B2H6), hydrogen gas, and/or hydrochloric acid. The one or more semiconductor processing tools may further perform post etching including applying hydrochloric acid, among other examples. In some implementations, the boron doped silicon regions 218 are deposited with a concentration of boron that is constant or gradient and in a range of approximately 1 E20 per cm^(3) to approximately 5 E20 per cm^(3) (e.g., in a range of approximately 0.2% to approximately 0.5%).

In some implementations, the boron doped silicon regions 218 are disposed on the set of silicon layers 206 and not on the inner spacers 214 that are disposed on the ends of the silicon germanium layers 204. In some implementations, the boron doped silicon regions 218 include a portion disposed on a top surface of the buffer layer 216. The boron doped silicon regions 218 (e.g., a ceramic material) may be deposited and/or applied using a thin film process. For example, the boron doped silicon regions 218 may be formed using a powdered form of boron doped silicon material, a powdered form of silicon material and a powdered form of boron material, or a powdered form of one of silicon or boron material, among other examples.

In some implementations, distances (e.g., a thickness) of the boron doped silicon regions 218 from an outer portion (e.g., at an end surface of the set of silicon layers 206) to an inner portion (e.g., where the boron doped silicon regions 218 terminate within the recessed portion) may increase based on being closer to the top surface of the buffer layer 216. For example, a top-most portion of the boron doped silicon regions may have a distance D3, a next top-most portion of the boron doped silicon regions may have a distance D2 that is greater than D3, and a next top-most portion (e.g., a bottom-most portion) of the boron doped silicon regions may have a distance D1 that is greater than D2 and D3. The distances may be in a range of approximately 1 nm to approximately 7 nm (e.g., approximately 1-3 nm for D3, approximately 2-5 nm for D2, and/or approximately 3-7 nm for D1). In some implementations, the boron doped silicon regions 218 disposed on the set of silicon layers 206 may have thicknesses (e.g., in a height-based direction from the bottom of the recessed portion) in a range of approximately 3 nm to approximately 8 nm. In some implementations, the boron doped silicon regions 218 disposed on the buffer layer 216 has a thickness in a range of approximately 3 nm to approximately 10 nm.

Figure 2D:
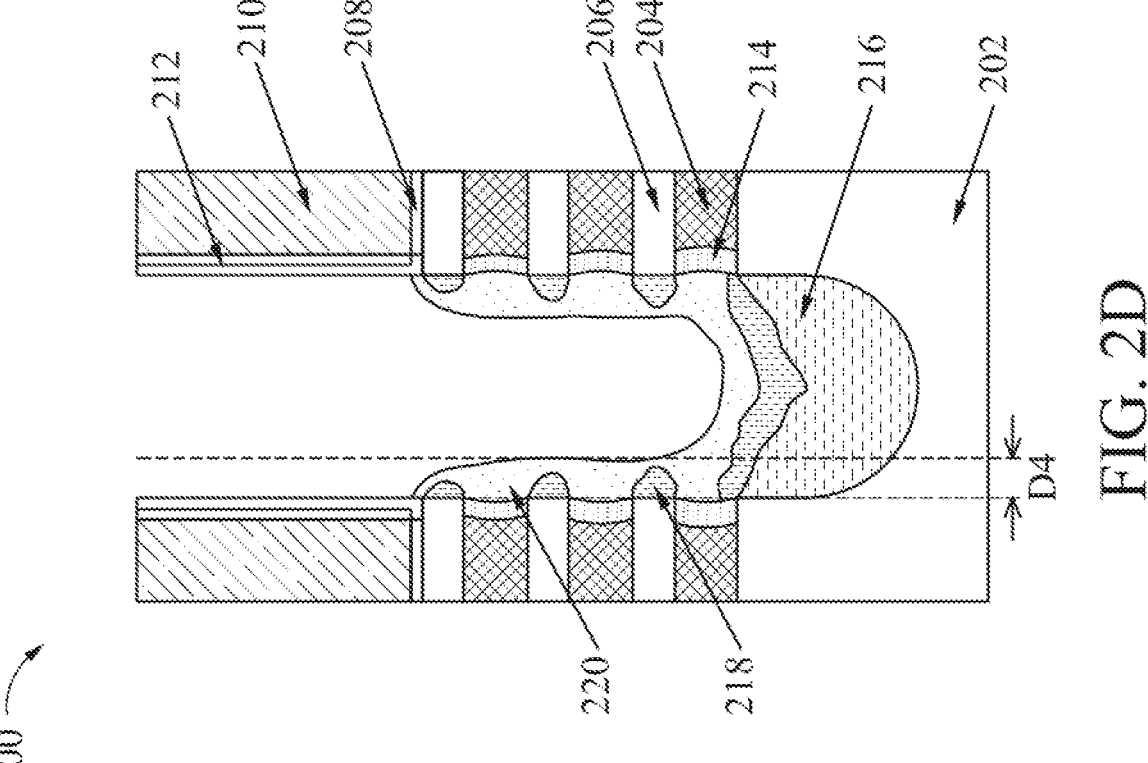

As shown in FIG. 2D, the semiconductor device 200 may include intermediate filler regions 220 (also referred to as a second source/drain material 220, L1-2 220 of the source/drain region, or a second layer 220 of the source/drain region) disposed on the boron doped silicon regions 218 within the recessed portion. In some implementations, one or more semiconductor processing tools (e.g., deposition tool 102) deposit the intermediate filler regions 220 within the recessed portion using, for example, selective etching growth. For example, the one or more semiconductor processing tools may apply precursor gases including germane (GeH4), dichlorosilane, diborane(6) (B2H6), hydrogen gas, and/or hydrochloric acid. The one or more semiconductor processing tools may further perform post etching including applying hydrochloric acid, among other examples, to form desired shapes of the intermediate filler regions 220 between the boron doped silicon regions 218.

In some implementations, a distance D4 of the intermediate filler regions 220 from an outer portion (e.g., at an end surface of the set of silicon layers 206 and/or the inner spacers 214) to an inner portion (e.g., where the intermediate filler regions 220 terminate within the recessed portion) is greater than D1, D2, and D3. For example, the distance D4 may be in a range of approximately 5 nm to approximately 15 nm. In some implementations, a ratio of the distance D4 to a greatest distance (e.g., D3) of the boron doped silicon regions deposited on the set of silicon layers 206 is in a range of approximately 1.2 to approximately 1.4. In some implementations, the intermediate filler regions 220 are deposited with a concentration of germanium that is approximately equal to a concentration of germanium in the set of silicon germanium nanostructures 204. In some implementations, the intermediate filler regions 220 are deposited with a concentration of boron that is constant or gradient and in a range of approximately 1 E20 per cm^(3) to approximately 1 E21 per cm^(3) (e.g., in a range of approximately 0.5% to approximately 1.5%). In some implementations, the concentration of the boron may be gradient based on adjusting ratios of the precursor gases during deposition. In some implementations, the boron doping concentration is gradient at a beginning portion of the deposition and is constant in an ending portion of the deposition.

Figure 2E:
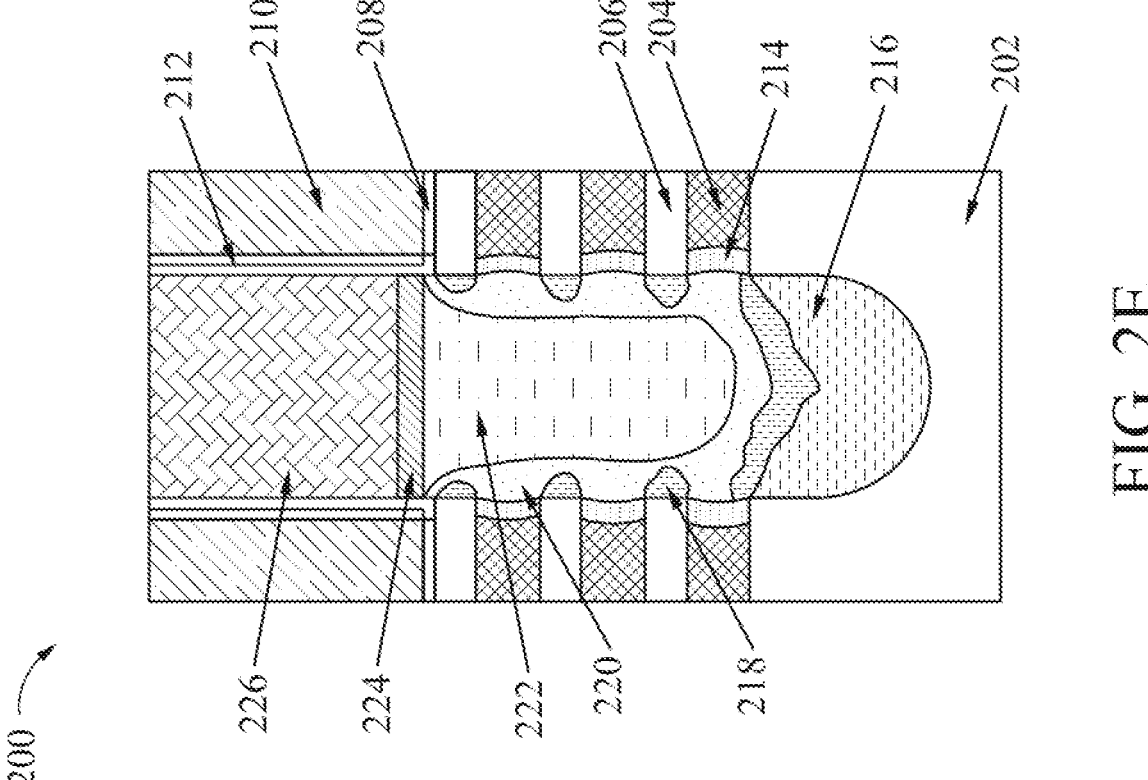

As shown in FIG. 2E, the semiconductor device 200 includes an epitaxial material 222 (also referred to as a third source/drain material 222, L2 222 of the source/drain region, or a third layer 222 of the source/drain region) disposed on the intermediate filler regions 220 within the recessed portion. In some implementations, the one or more semiconductor processing tools (e.g., deposition tool 102) deposit the epitaxial material 222 using an epitaxial growth deposition operation. For example, the epitaxial growth deposition operation may include a reduced pressure CVD (RPCVD) operation in separate chambers. In some implementations, one or more semiconductor processing tools deposit the epitaxial material 222 within the recessed portion using, for example, selective etching growth. For example, the one or more semiconductor processing tools may apply precursor gases including germane (GeH4), dichlorosilane, and/or hydrochloric acid. The one or more semiconductor processing tools may further perform post etching including applying hydrochloric acid, among other examples, to etch away a top portion of the epitaxial material 222 from the sacrificial structure 210 and/or a silicon germanium material of the fin stack. In this way, the epitaxial material 222 is not in contact with any portion of the fin stack that may be replaced with a metal gate structure, which may reduce or eliminate boron diffusion into the metal gate structure.

In some implementations, the epitaxial material 222 includes boron-doped silicon germanium. The epitaxial material 222 may include a higher volume and/or a higher active dopant concentration than any of the buffer layer 216, the boron doped silicon regions 218, and the intermediate filler regions 220. For example, the epitaxial material 222 may have a boron concentration in a range of approximately 5 E20 per cm^(3) to approximately 1 E22 per cm^(3) (e.g., in a range of approximately 1% to approximately 10%). In this way, the epitaxial material 222 may improve parasitic resistance (e.g., resistance for parasitic current).

The epitaxial material 222 may have a diameter (e.g., in line with D1, D2, D3, and/or D4) in a range of approximately 20 nm to approximately 100 nm and/or may have a height in a range of approximately 40 nm to approximately 100 nm. The epitaxial material 222 may fill the recessed portion (e.g., completely fill the recessed portion).

As further shown in FIG. 2E, the semiconductor device 200 may include a capping structure 224 disposed on a top surface of the epitaxial material 222. In some implementations, one or more semiconductor processing tools (e.g., deposition tool 102) deposit the capping structure 224. The capping structure may further reduce diffusion of boron from the epitaxial material 222 into other structures of the semiconductor device 200. The capping structure 224 may be deposited without boron doping. In some implementations, the capping structure 224 (e.g., on the third source/drain material 222) includes silicone and phosphorus (e.g., SiP) or silicon germanium with boron doping (e.g., SiGe:B). SiGe:B may act as a cap layer for the source/drain regions (e.g., the epitaxial material). This may also contribute to metal-semiconductor (silicide) alloy formation. A width (shown in a horizontal direction) of the capping structure (e.g., between nanostructures 204 or 206) may be in a range from approximately 20 nm and approximately 60 nm. A thickness (e.g., shown in a vertical direction) may be in a range from approximately 10 nm and approximately 30 nm. Boron concentration may be in a range of approximately $1\times10^{21}$ to $3\times10^{21}$ atoms/cm3 and/or 1-6% of the SiGe:B. In some implementations, one or more semiconductor processing deices may perform L3 deposition (e.g., deposition of the capping structure 224) using GeH4+Dichlorosilane (DCS)+Hydrochloric acid (HCL). The capping structure 224 (e.g., S/D cap) may completely cover the epitaxial material 222 and/or may touch one or more of the silicon nano structures 206, the inner spacers 214, and/or the fin sidewall spacer 212 (e.g., at a top of the nano structures and/or a gate sidewall spacer). In some implementations, the capping structure 224 may be deposited with, or implanted with, an active dopant, which may reduce contact resistance of the device. In some implementations, the capping structure may have a generally planer upper surface or may have a generally convex upper surface.

As further shown in FIG. 2E, the semiconductor device 200 may include an inter-layer dielectric 226 disposed above the epitaxial material 222 (e.g., on the capping structure 224). In some implementations, one or more semiconductor processing tools (e.g., deposition tool 102) deposit the inter-layer dielectric 226. The inter-layer dielectric 226 may include a low-k material, such as silicon dioxide, silicon nitride, or silicon oxynitride, among other examples. The inter-layer dielectric 226 may provide structural support to the semiconductor device 200 and electrical insulation between structures within the semiconductor device 200. In some implementations, the inter-layer dielectric 226 may fill (e.g., without voids) a volume between the fin sidewall spacers 212.

Figure 2F:
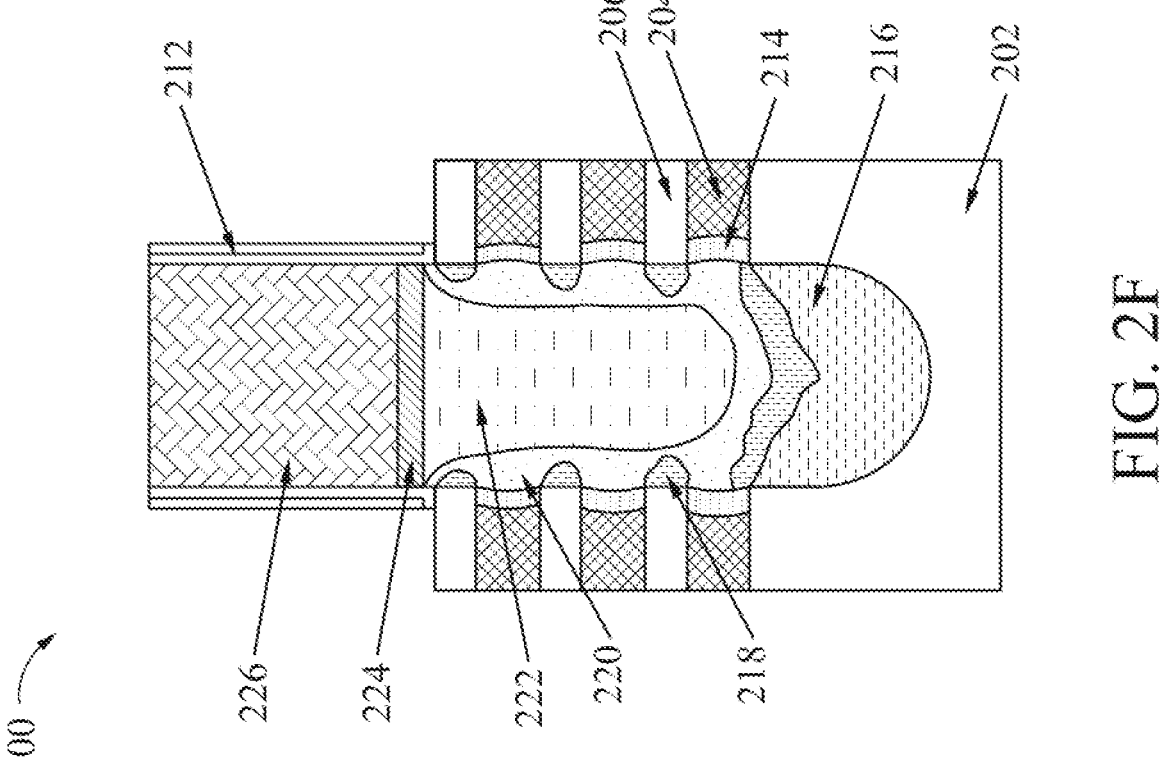

As shown in FIG. 2F, the sacrificial structure 210 (e.g., a dielectric layer, an interlayer dielectric (ILD) zero (ILD0) layer or another ILD layer) may be removed from the semiconductor device 200. The sacrificial structure 210 may be removed in one or more etch operations, such as a plasma etch technique, which may include a wet chemical etch technique and/or another type of etch technique.

Figure 2G:
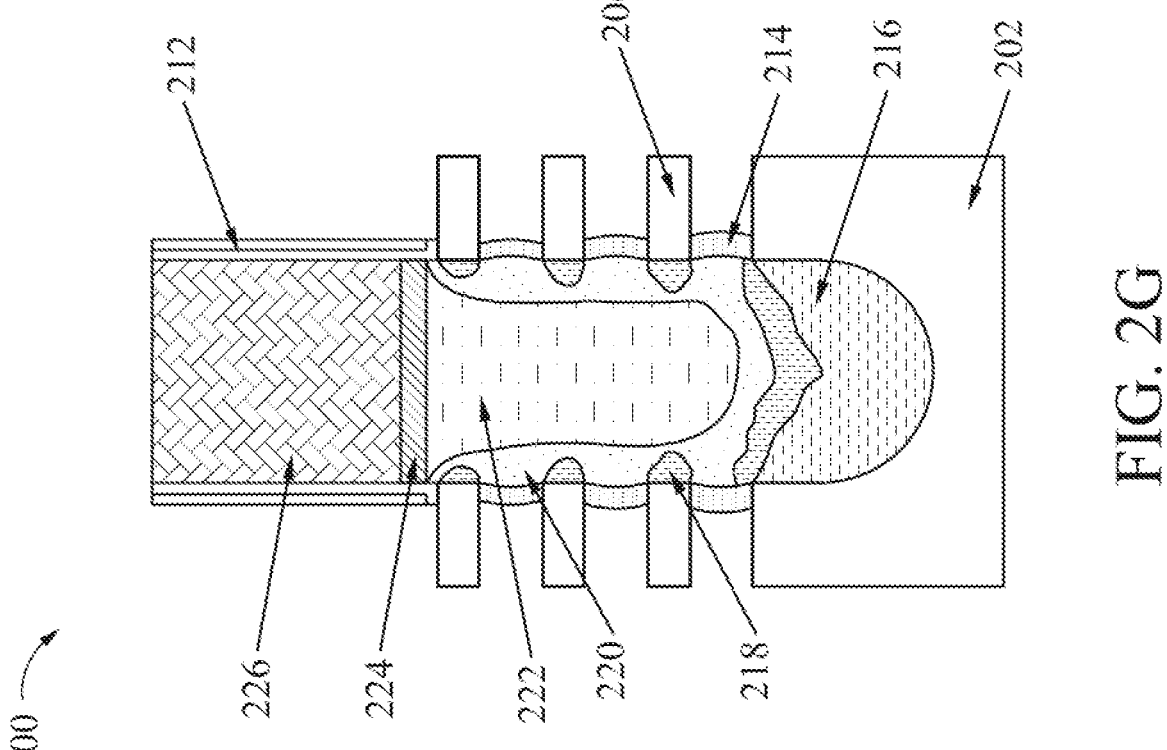

As shown in FIG. 2G, a nanostructure release operation is performed to remove the set of silicon germanium layers 204. This results in openings between the set of silicon layers 206 (e.g., the volumes around the set of silicon layers 206 previously occupied by the set of silicon germanium layers 204). The nanostructure release operation may include the etching tool 104 performing an etch operation to remove the set of silicon germanium layers 204 based on a difference in etch selectivity between the material of the set of silicon germanium layers 204 and the material of the set of silicon layers 206, and between the material of the set of silicon germanium layers 204 and the material of the inner spacers 214. The inner spacers 214 may function as etch stop layers in the etch operation to protect the source/drain regions (e.g., boron doped silicon regions 218, the intermediate filler regions 220, and/or the epitaxial material 222) from being etched.

Figure 2H:
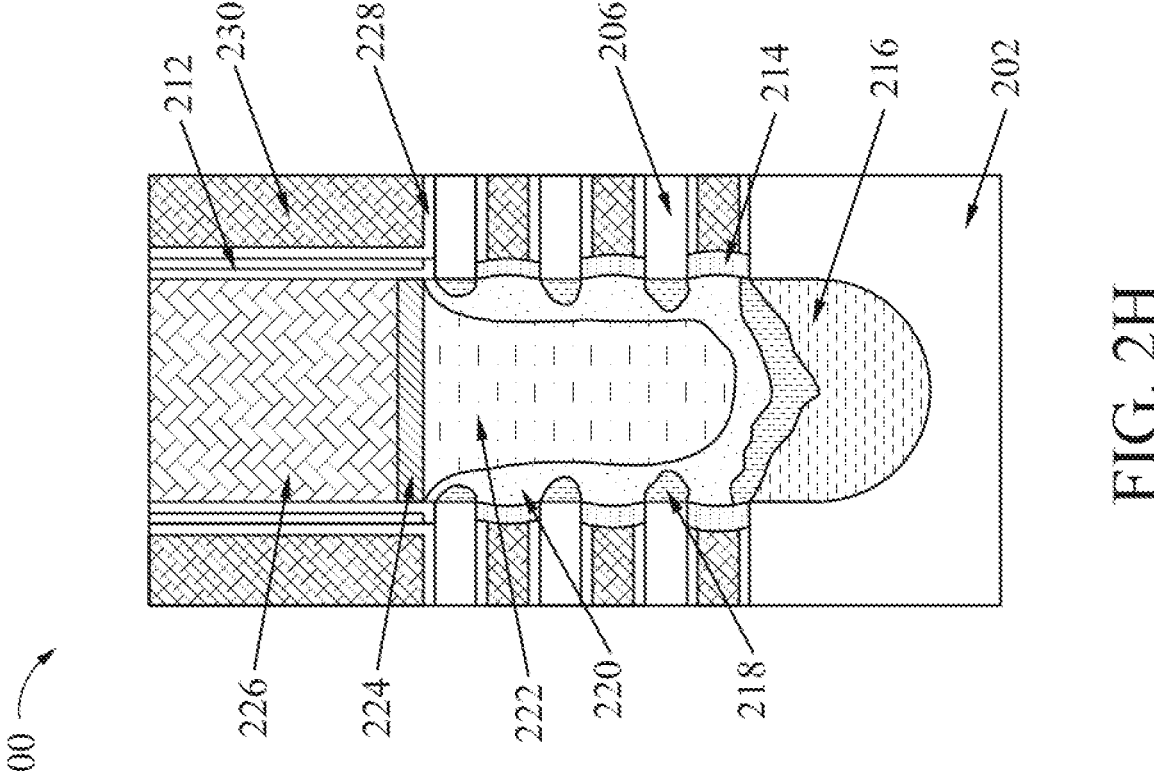

As shown in FIG. 2H, the deposition tool 102 forms gate structures 230 (e.g., replacement gate structures) in the openings between the source/drain regions and in the space above the set of silicon layers 206 (e.g., channels) previously occupied by the set of silicon germanium layers 204 and the sacrificial structure 210. In this way, the gate structures 230 wrap around each of the set of silicon layers 206. The gate structures 230 may include metal gate structures. A conformal high-k dielectric liner 228 may be deposited onto the set of silicon layers 206. The gate structures 230 may include additional layers such as an interfacial layer, a work function tuning layer, and/or a metal electrode structure, among other examples.

Figure 2I:
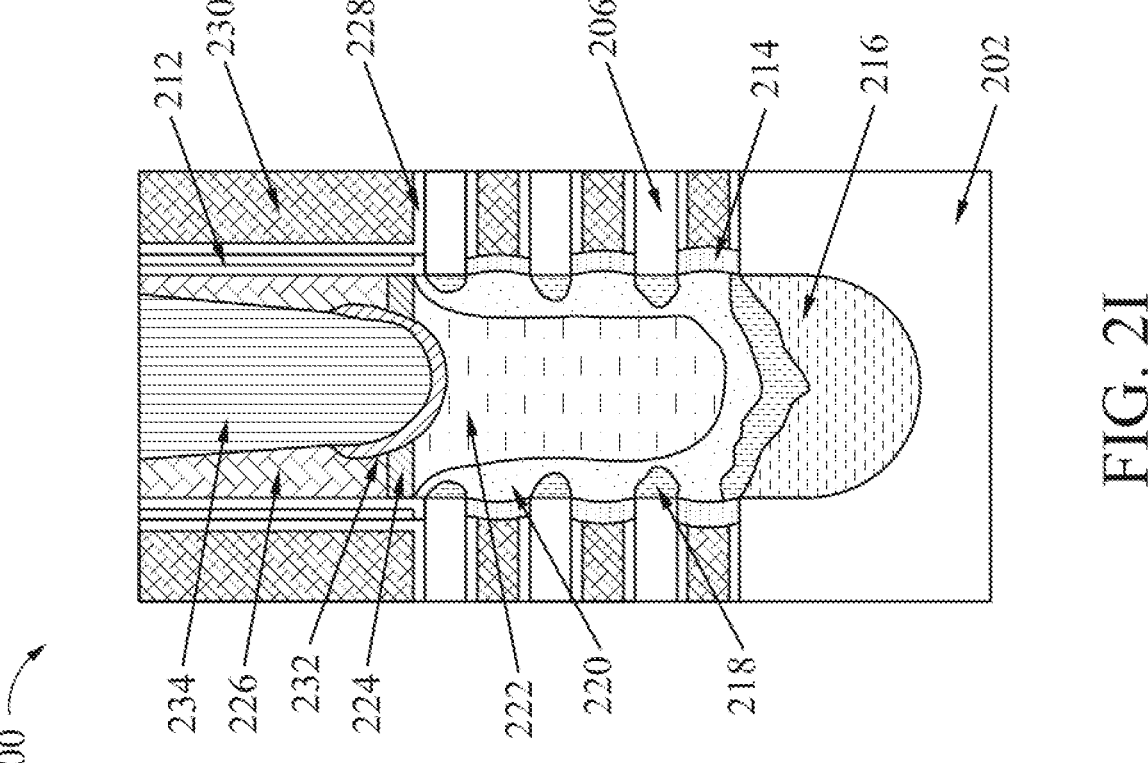

As shown in FIG. 2I, the semiconductor device 200 may include a connector that provides an electrical pathway to the epitaxial material 222. In some implementations, one or more semiconductor processing tools (e.g., deposition tool 102) deposit a liner 232 and a conductive structure 234 through the inter-layer dielectric 226. For example, one or more semiconductor processing tools may etch a portion of the inter-layer dielectric 226 to form a recessed portion before depositing the liner 232 and then the conductive structure 234 within the recessed portion of the inter-layer dielectric 226. The liner 232 may include a metal silicide, such as titanium silicide, copper silicide, or nickel silicide, among other examples. The conductive structure 232 may include a tungsten-based material, a ruthenium-based material, and/or a cobalt-based material, among other examples.

Based on depositing the source/drain region using multiple deposition operations, as described herein, the source/drain region has a reduced likelihood of forming voids within the source/drain region. Based on having the reduced likelihood of forming voids within the source/drain region, a resistance within the source/drain region may be reduced, which may reduce an amount of voltage required to operate using the source/drain region and/or reduce a likelihood of the source/drain region failing.

As indicated above, FIGS. 2A-2F are provided as an example. Other examples may differ from what is described with regard to FIGS. 2A-2F. The number and arrangement of devices, layers, and/or materials shown in FIGS. 2A-2F are provided as an example. In practice, there may be additional devices, layers, and/or materials, fewer devices, layers, and/or materials, different devices, layers, and/or materials, or differently arranged devices, layers, and/or materials than those shown in FIGS. 2A-2F. In some implementations, a planarization tool 106 may be used to planarize one or more materials of the semiconductor structure 200 after a deposition or etching operation. In this way, a top surface of the semiconductor structure 200 may be suited for further deposition and/or etching operations.

FIGS. 3A-3I are diagrams of an example semiconductor device 300 described herein. Semiconductor device 300 may be manufactured using an example process as shown in FIGS. 3A-3I. The example process may include one or more other operations (e.g., lithography operations, operations performed on different portions of an electronic device that includes the semiconductor device 300). The operations shown in the example process may be performed in a different order from the order shown in FIGS. 3A-3I. The semiconductor device 300 may include one or more additional devices, structures, and/or layers not shown in FIGS. 3A-3I. For example, the semiconductor device 300 may include additional layers and/or dies formed on layers above and/or below the portion of the semiconductor device 300 shown in FIGS. 3A-3I. Additionally, or alternatively, one or more additional semiconductor structures and/or semiconductor devices may be formed in a same layer of an electronic device that includes the semiconductor device, with a lateral displacement, as the semiconductor device 300 shown in FIGS. 3A-3I. The semiconductor device 300 may be used in a FinFET structure having a narrow critical dimension (e.g., a lateral dimension as shown in FIGS. 3A-3I), such as an N3 FinFET structure and/or a GAA FET structure. In some aspects, the semiconductor device 300 may include the semiconductor device 200 as shown in FIGS. 2A-2F.

As shown in FIG. 3A, the semiconductor device 300 may include a substrate 202, and a fin stack disposed on the substrate 202 and having alternating layers of silicon-based materials (e.g., nanosheets). The alternating layers of silicon-based materials may include a set of silicon germanium (SiGe) layers 204 and a set of silicon layers 206 (e.g., as described in connection with FIGS. 2A-2F). The semiconductor device 300 may include an oxide layer 208 (e.g., a gate oxide) disposed on a top surface of the fin stack (e.g., on a top surface of a top-most silicon layer 206). The semiconductor device 300 may further include a sacrificial structure 210, as described in connection with FIGS. 2A-2F. The sacrificial structure 210 may be etched to form recessed portions between remaining elements of the sacrificial structure 210.

As shown in FIG. 3B, the semiconductor device 300 may include a fin sidewall spacer 212 deposited as a liner within the recessed portions of the sacrificial structure 210. In some implementations, one or more semiconductor processing tools (e.g., deposition tool 102) deposit the fin sidewall spacer 212 using a chemical vapor deposition or another technique to provide a substantially even layer of material of the fin sidewall spacer 212 within the recessed portions of the sacrificial structure 210. In some implementations, the fin sidewall spacer 212 may include multiple layers of spacer material. For example, the fin sidewall spacer 212 may include an adhesive layer, a dielectric material (e.g., one or more oxide layers and/or nitride layers, among other examples), and/or a silicon-based material (e.g., silicon germanium, silicon oxide, or silicon nitride, among other examples), among other examples.

As shown in FIG. 3C, the semiconductor device 300 may include recessed portions for source/drain regions of the semiconductor device 300 (e.g., a strained source/drain) disposed between fin stacks. In some implementations, one or more semiconductor processing tools (e.g., etching tool 104) etch the set of silicon germanium layers 204, the set of silicon layers 206, and a portion of the substrate 202 to form the recessed portions. The one or more semiconductor processing tools (e.g., etching tool 104) may use a cyclic photo-etch process to form the recessed portion.

As shown in FIG. 3D the semiconductor device 300 may include recessed portions of the set of silicon germanium layers 204. For example, the one or more semiconductor processing tools (e.g., etching tool 104) may etch away portions of the set of silicon germanium layers 204 that are exposed to the recessed portion (e.g., as shown in FIG. 3D) and/or may etch away silicon nitride and/or silicon carbon oxynitride (SiCON) fin sidewall materials. For example, the one or more semiconductor processing tools may provide methane (CH4), trifluoromethane (CHF3), oxygen gas (O2), hydrogen bromide (HBr), silicon tetrachloride (SiCl4), sulfur dioxide (SO2), Sulfur hexafluoride (SF6), helium gas (He), and/or hydrogen gas (H2), among other examples, as a gas-based etchant. The gas-based etchant may be applied at a pressure in a range of approximately 5 milliTors (mTors) to approximately 100 mTors and/or at a temperature in a range of approximately 25 degrees Celsius and approximately 150 degrees Celsius.

As shown in FIG. 3E, the semiconductor device 300 may include an inner spacer 214 deposited on a surface of the recessed portions. In some implementations, one or more semiconductor processing tools (e.g., deposition tool 102) deposit the inner spacer 214 within the recessed portions of the set of silicon germanium layers 204 and on other materials that form surfaces of the recessed portions.

As shown in FIG. 3F, the recessed portion of the semiconductor device 300 may be trimmed to remove the inner spacer 214 from surfaces of the recessed portion, except at the recessed portions of set of silicon germanium layers 204. For example, one or more semiconductor processing tools (e.g., etching tool 104) may remove a portion of the inner spacer 214 such that the inner spacer 214 fills the recessed portion of the set of silicon germanium layers 204 to form a substantially smooth surface of the recessed portion of the semiconductor device 300.

As shown in FIG. 3G, the semiconductor device 300 includes a buffer layer 216 deposited in the recessed portions of the semiconductor device 300 such that a bottom portion of the recessed portions are filled with the buffer layer 216. For example, one or more semiconductor processing tools (e.g., deposition tool 102) may deposit the buffer layer 216 as described in connection with FIG. 2B.

As shown in FIG. 3H, the semiconductor device includes a p-type epitaxial (PEPI) material 222A. In some implementations, one or more semiconductor processing tools deposit the PEPI material 222A within a first recessed portion. For example, one or more semiconductor processing tools may deposit a photoresist layer on a second recessed portion and/or on one or more other portions of the semiconductor device 300 on which the PEPI material 222A is not desired to be deposited, deposit the PEPI material 222A, and remove the photoresist layer. In some aspects, the one or more semiconductor processing tools deposit the PEPI material 222A as described in connection with FIGS. 2A-2E. For example, the PEPI material 222A may include the boron doped silicon regions 218, the intermediate filler regions 220, and the epitaxial material 222 having a positive dopant (e.g., boron).

Figure 3I:
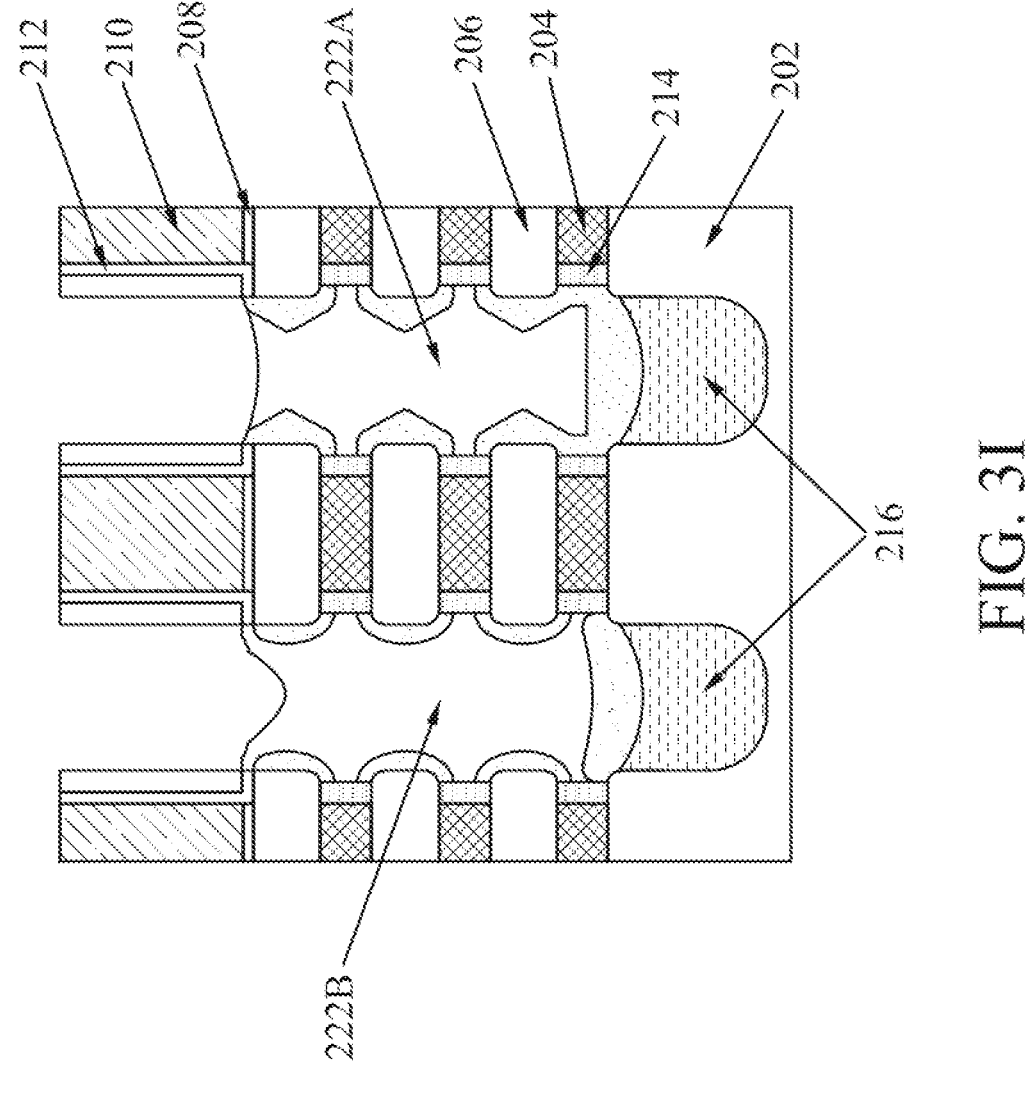

As shown in FIG. 3I, the semiconductor device includes a n-type epitaxial (NEPI) material 222B. In some implementations, one or more semiconductor processing tools deposit the NEPI material 222B within a second recessed portion. For example, one or more semiconductor processing tools may deposit a photoresist layer on the first recessed portion and/or on one or more other portions of the semiconductor device 300 on which the NEPI material 222B is not desired to be deposited, deposit the NEPI material 222B, and remove the photoresist layer. In some aspects, the one or more semiconductor processing tools deposit the NEPI material 222B as described in connection with FIGS. 2A-2E, with replacing the boron doping with a negative dopant (e.g., phosphorus). For example, the NEPI material 222B may include doped L1-1 regions similar to, but opposite ionization from, the boron doped silicon regions 218; intermediate filler regions that are similar to, but opposite ionization from, the intermediate filler regions 220; and the NEPI material 222B having a dopant (e.g., phosphorus).

As indicated above, FIGS. 3A-3I are provided as an example. Other examples may differ from what is described with regard to FIGS. 3A-3I. The number and arrangement of devices, layers, and/or materials shown in FIGS. 3A-3I are provided as an example. In practice, there may be additional devices, layers, and/or materials, fewer devices, layers, and/or materials, different devices, layers, and/or materials, or differently arranged devices, layers, and/or materials than those shown in FIGS. 3A-3I. In some implementations, a planarization tool 106 may be used to planarize one or more materials of the semiconductor device 300 after a deposition or etching operation. In this way, a top surface of the semiconductor device 300 may be suited for further deposition and/or etching operations.

FIGS. 4A-4H are diagrams of an example semiconductor device 400 described herein. Semiconductor device 400 may be manufactured using an example process as shown in FIGS. 4A-4H. The example process may include one or more other operations (e.g., lithography operations, operations performed on different portions of an electronic device that includes the semiconductor device 400). The operations shown in the example process may be performed in a different order from the order shown in FIGS. 4A-4H. The semiconductor device 400 may include one or more additional devices, structures, and/or layers not shown in FIGS. 4A-4H. For example, the semiconductor device 400 may include additional layers and/or dies formed on layers above and/or below the portion of the semiconductor device 400 shown in FIGS. 4A-4H. Additionally, or alternatively, one or more additional semiconductor structures and/or semiconductor devices may be formed in a same layer of an electronic device that includes the semiconductor device, with a lateral displacement, as the semiconductor device 400 shown in FIGS. 4A-4H. The semiconductor device 400 may be used in a FinFET structure having a narrow critical dimension (e.g., a lateral dimension as shown in FIGS. 4A-4H), such as an N3 FinFET structure and/or a GAA FET structure. In some aspects, the semiconductor device 400 may include the semiconductor device 200 as shown in FIGS. 2A-2F and/or the semiconductor device 300 as shown in FIGS. 3A-3I.

Figures 4A, 4B:
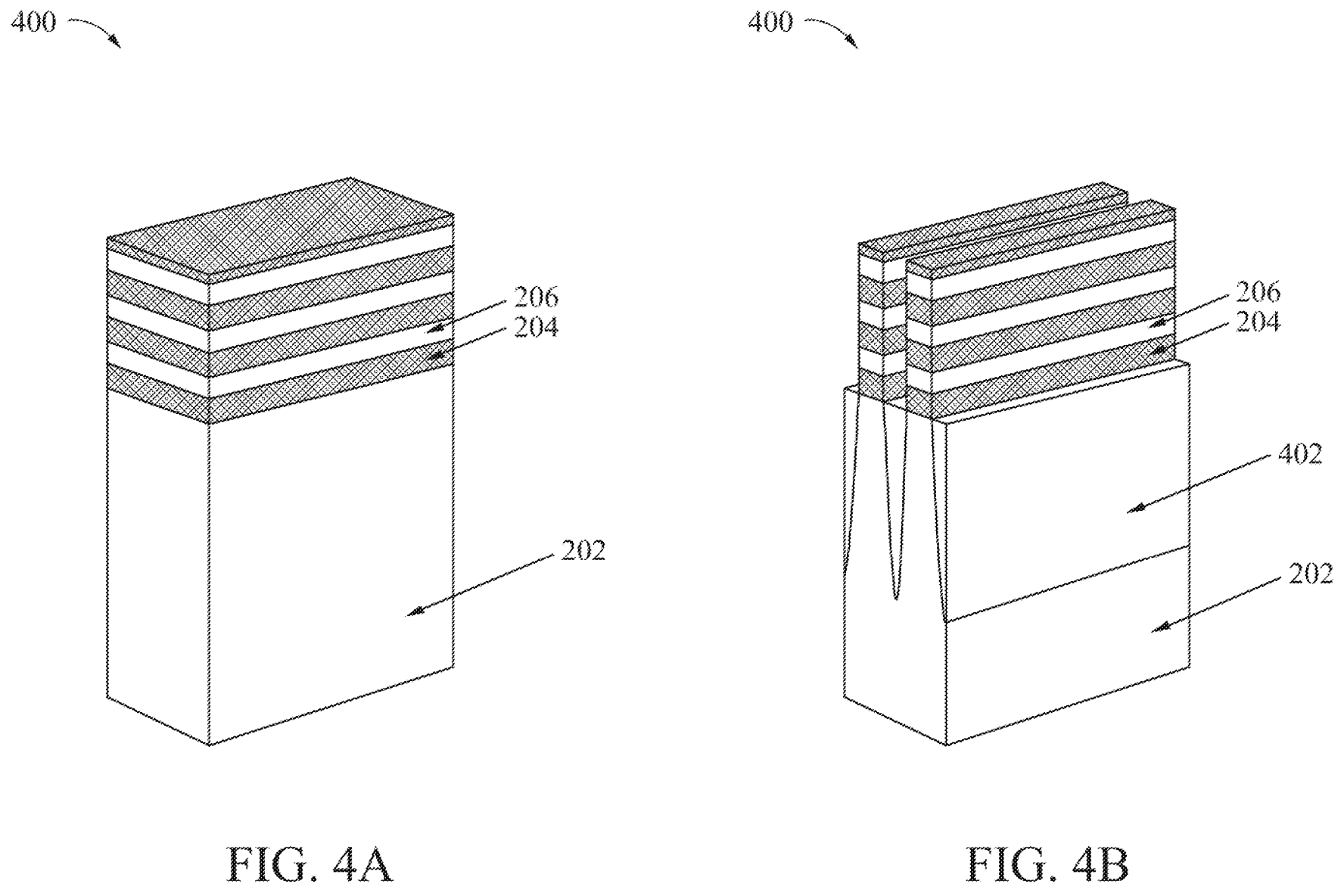

As shown in FIG. 4A, the semiconductor device 400 includes a stack of nanostructures (e.g., a superlattice growth) deposited on a substrate 202. In some implementations, one or more semiconductor processing tools (e.g., deposition tool 102) deposits a fin stack having alternating layers of silicon-based materials (e.g., nanosheets). The alternating layers of silicon-based materials may include a set of silicon germanium layers 204 and a set of silicon layers 206. The semiconductor device 400 may include an oxide layer 208 (e.g., a gate oxide) disposed on a top surface of the fin stack (e.g., on a top surface of a top-most silicon layer 206), as described in connection with FIG. 2A.

As shown in FIG. 4B, the semiconductor device 400 includes a set of fin stacks that include the alternating layers of silicon-based materials. In some implementations, one or more semiconductor processing tools (e.g., etching tool 104) etch portions of the alternating layers of the stack of nanostructures and the substrate 202 to form the set of fin stacks. One or more semiconductor processing tools (e.g., deposition tool 102) may deposit trench isolation structures 402 (e.g., a shallow trench isolation structure) between fin stacks of the set of fin stacks. The trench isolation structures 402 may include silicon oxide or silicon germanium, among other examples and may be configured to provide electrical insulation and/or isolation between substrate 202 and portions of a set of fins that include the set of fin stacks.

Figure 4C:
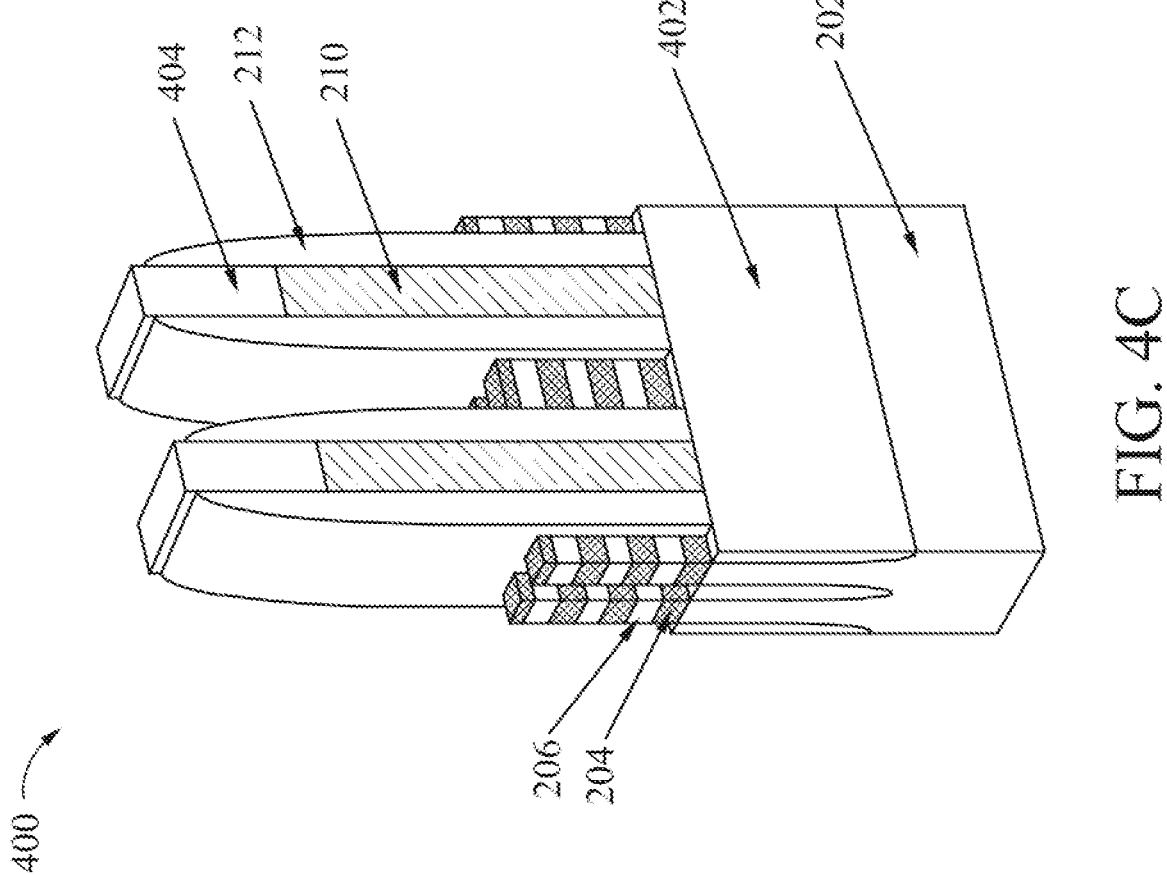

As shown in FIG. 4C, the semiconductor device 400 includes gate structures disposed on top of, between, and/or around the set of fin stacks and on top of the trench isolation structure 402. In some implementations, one or more semiconductor processing tools (e.g., deposition tool 102 and/or etching tool 104) form the gate structure (e.g., having a sacrificial structure 210, a fin sidewall spacer 212, and/or a hard mask layer 404) on top of, between, and/or around the fin stacks. For example, one or more semiconductor processing tools may deposit a layer of the sacrificial structure 210 with a generally planar top surface. One or more semiconductor processing tools may etch the sacrificial structure 210 to form inside structures of the gate structures. One or more semiconductor processing tools may deposit a layer of the fin sidewall spacer 212 on the inside structures of the gate structures. One or more semiconductor processing tools may etch a portion of the fin sidewall spacer 212 deposited on a top surface of the sacrificial structure 210 and one or more semiconductor processing tools may deposit the hard mask layer 404 on the top surface of the sacrificial structure 210.

Figure 4D:
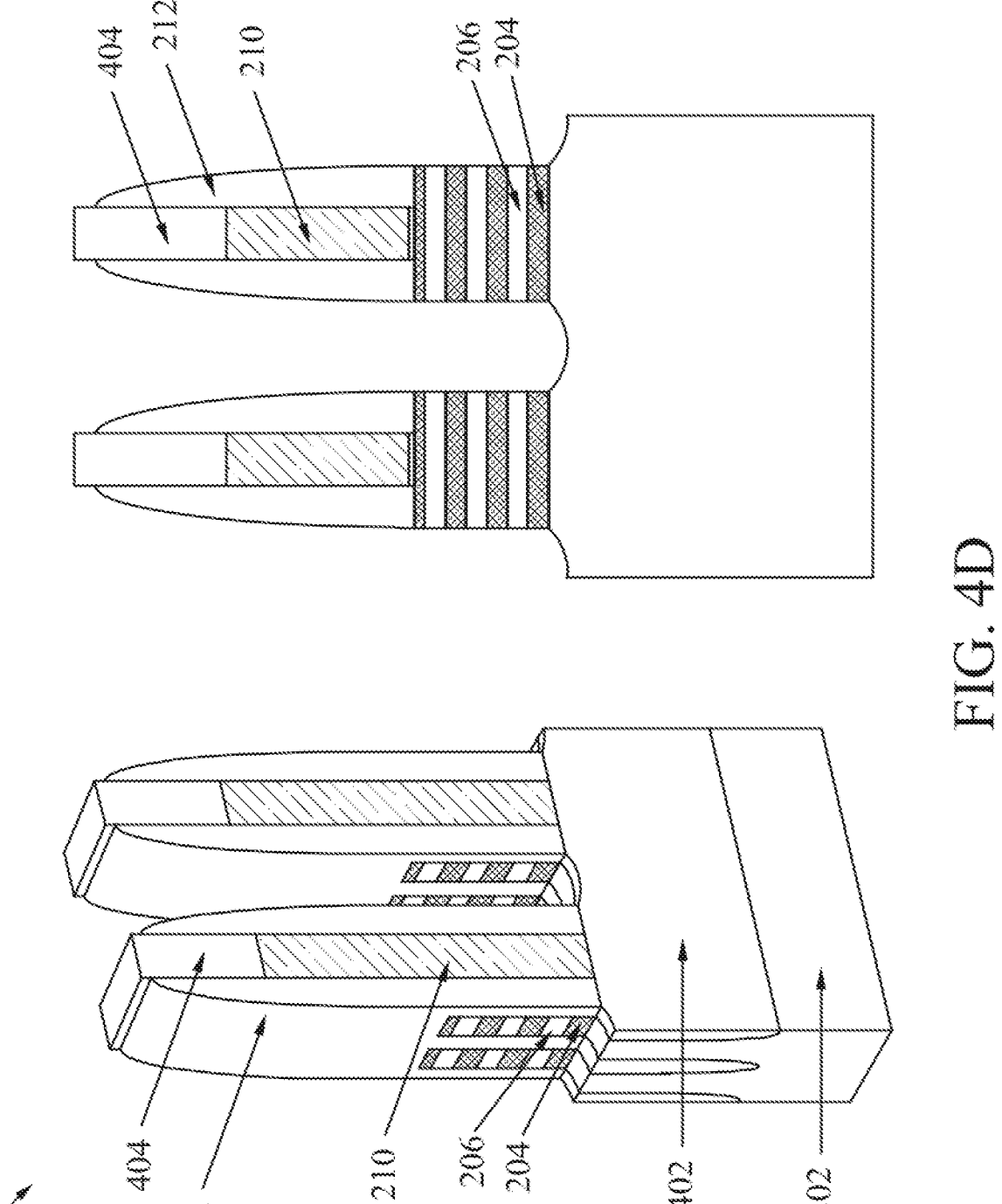

As shown in FIG. 4D, the semiconductor device 400 includes a recessed portion of the fin stacks, which recessed portion separates the fin stacks into separate fin stacks. In some implementations, one or more semiconductor processing tools (e.g., etching tool 104) may etch the fin stacks to form a recessed portion to be used for forming a source/drain region. FIG. 4D includes a first cross-section (e.g., shown on the left of FIG. 4D) that shows a portion of the semiconductor device 400 between fin stacks and a second cross-section (e.g., shown on the right of FIG. 4D) that shows a portion of the semiconductor device 400 on a fin stack.

In some implementations, FIG. 4D may correspond to FIG. 2A and/or FIG. 3C having the recessed portion disposed between gate stacks.

Figure 4E:
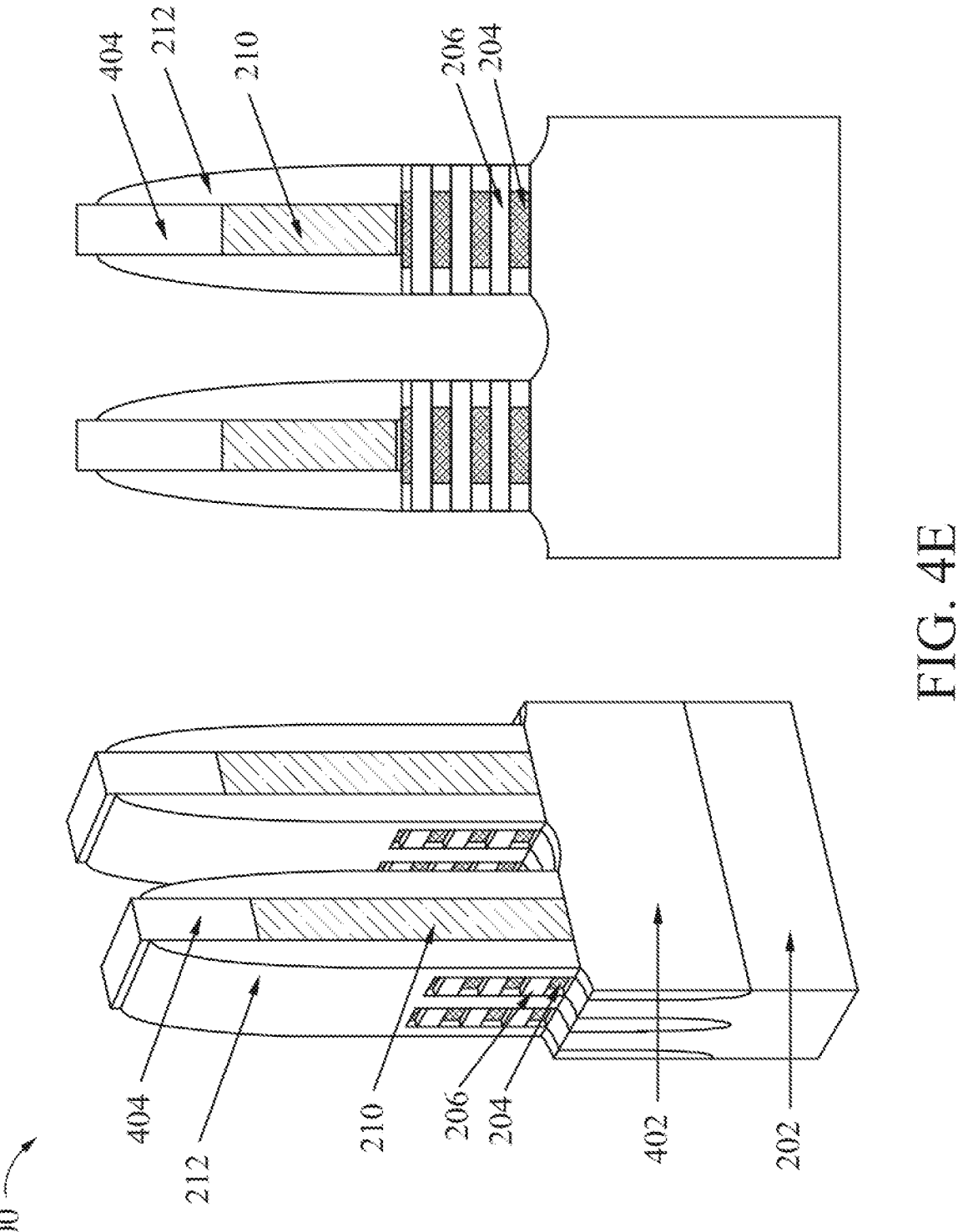

As shown in FIG. 4E, the semiconductor device 400 includes recessed portions of the set of silicon germanium layers 204. For example, the one or more semiconductor processing tools (e.g., etching tool 104) may etch away portions of the set of silicon germanium layers 204 that are exposed to the recessed portion (e.g., as shown in FIG. 3D) and/or may etch away silicon nitride and/or silicon carbon oxynitride (SiCON) fin sidewall materials. For example, the one or more semiconductor processing tools may provide methane, trifluoromethane, oxygen gas, hydrogen bromide, silicon tetrachloride, sulfur dioxide, sulfur hexafluoride, helium gas, and/or hydrogen gas, among other examples, as a gas-based etchant. The gas-based etchant may be applied at a pressure in a range of approximately 5 mTors to approximately 100 mTors and/or at a temperature in a range of approximately 25 degrees Celsius and approximately 150 degrees Celsius.

As shown in FIG. 4F, the semiconductor device 400 includes inner spacers 214 deposited on surfaces of the recessed portions of the set of silicon germanium layers 204. In some implementations, one or more semiconductor processing tools (e.g., deposition tool 102) deposit material of the inner spacers 214 within the recessed portions of the set of silicon germanium layers 204 and on other materials that form surfaces of the recessed portions and one or more semiconductor processing tools (e.g., etching tool 104) removes a portion of the material of the inner spacers 214 such that the inner spacer 214 fills the recessed portions of the set of silicon germanium layers 204 to form a substantially smooth surface of the recessed portion of the semiconductor device 400.

Figure 4H:
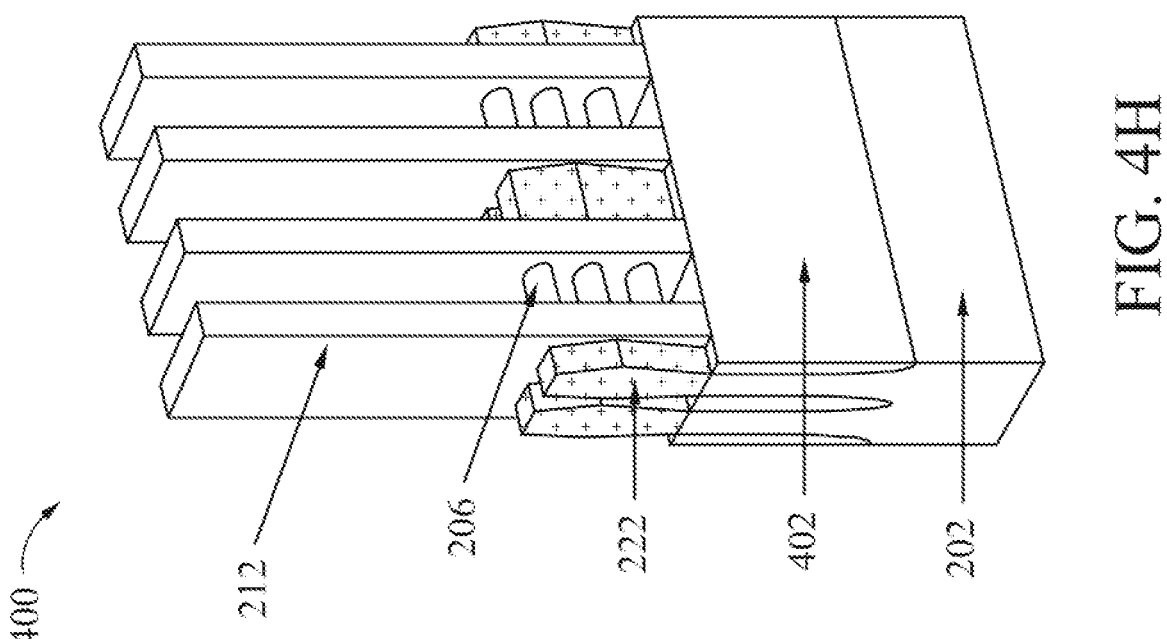
Figure 4G:
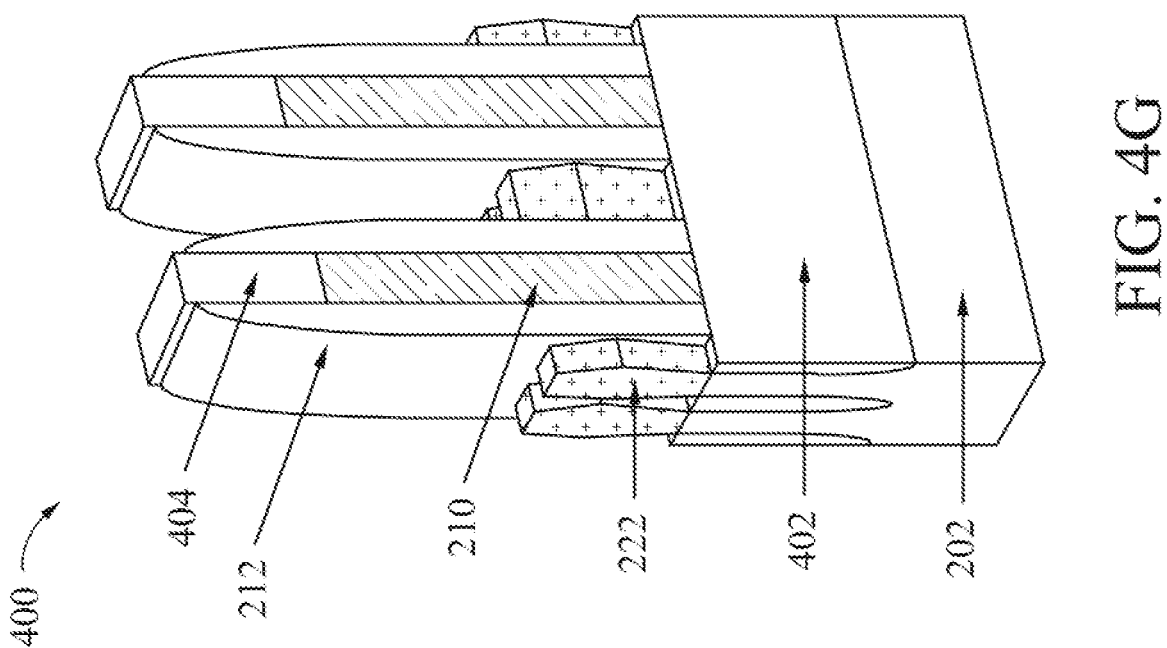

As shown in FIG. 4G, the semiconductor device 400 includes epitaxial material 222 formed as source/drains of the semiconductor device 400 between portions of the fin stacks. In some implementations, one or more semiconductor processing tools (e.g., deposition tool 102) deposit material for the source/drains as described herein (e.g., in connection with FIGS. 2A-2F and/or in connection with FIGS. 3A-3H). For example, the epitaxial material 222 may include boron doped silicon regions 218, intermediate filler regions 220, and epitaxial material 222 having a dopant (e.g., boron or phosphorus, among other examples).

As shown in FIG. 4H, the semiconductor device includes a void between the fin sidewall spacer 212 and the silicon nanostructures 206. For example, one or more semiconductor processing tools (e.g., etching tool 104) may etch the hard mask 404 and the sacrificial structure 210 to form the void between the fin sidewall spacer 212 and the silicon nanostructures 206. For example, as shown in FIGS. 2F-2H, the sacrificial structure 210 may be removed from the semiconductor device 200. The sacrificial structure 210 may be removed in one or more etch operations, such as a plasma etch technique, which may include a wet chemical etch technique and/or another type of etch technique. A nanostructure release operation may be performed to remove the set of silicon germanium layers 204. This results in openings between the set of silicon layers 206 (e.g., the volumes around the set of silicon layers 206 previously occupied by the set of silicon germanium layers 204). The nanostructure release operation may include the etching tool 104 performing an etch operation to remove the set of silicon germanium layers 204 based on a difference in etch selectivity between the material of the set of silicon germanium layers 204 and the material of the set of silicon layers 206, and between the material of the set of silicon germanium layers 204 and the material of the inner spacers 214. The inner spacers 214 may function as etch stop layers in the etch operation to protect the source/drain regions (e.g., boron doped silicon regions 218, the intermediate filler regions 220, and/or the epitaxial material 222) from being etched.

The deposition tool 102 may form gate structures 230 (e.g., replacement gate structures) in the openings between the source/drain regions and in the space above the set of silicon layers 206 (e.g., channels) previously occupied by the set of silicon germanium layers 204 and the sacrificial structure 210. In this way, the gate structures 230 surround the set of silicon layers 206. The gate structures 230 may include metal gate structures. A conformal high-k dielectric liner 228 may be deposited onto the set of silicon layers 206. The gate structures 230 may include additional layers such as an interfacial layer, a work function tuning layer, and/or a metal electrode structure, among other examples.

As indicated above, FIGS. 4A-4H are provided as an example. Other examples may differ from what is described with regard to FIGS. 4A-4H. The number and arrangement of devices, layers, and/or materials shown in FIGS. 4A-4H are provided as an example. In practice, there may be additional devices, layers, and/or materials, fewer devices, layers, and/or materials, different devices, layers, and/or materials, or differently arranged devices, layers, and/or materials than those shown in FIGS. 4A-4H. In some implementations, a planarization tool 106 may be used to planarize one or more materials of the semiconductor device 400 after a deposition or etching operation. In this way, a top surface of the semiconductor device 400 may be suited for further deposition and/or etching operations.

Figure 5:
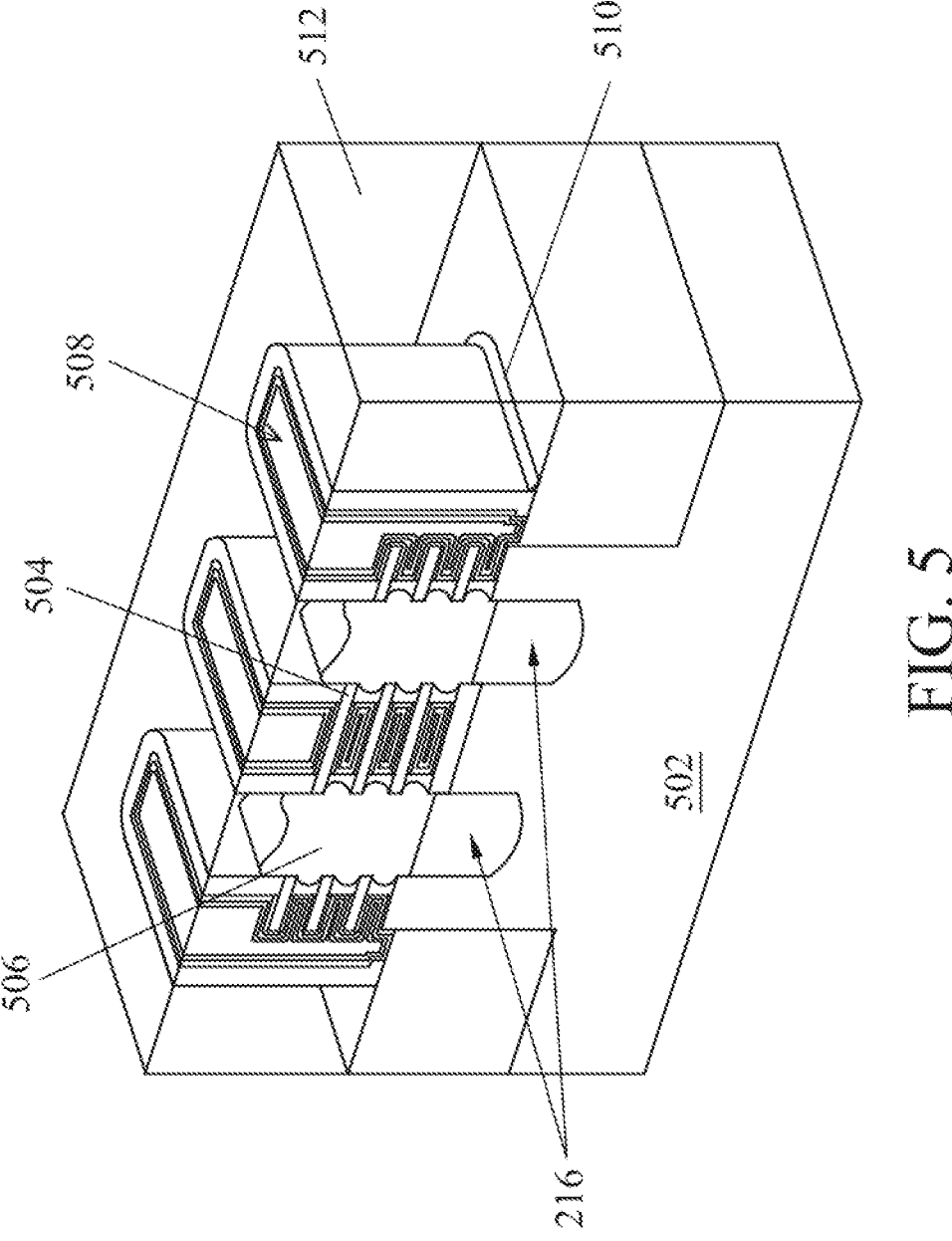
FIG. 5 is a diagram of an example semiconductor device described herein.

FIG. 5 is a diagram of an example semiconductor device 500 described herein. Semiconductor device 500 may be manufactured using an example process as shown in FIGS. 2A-2F, 3A-3I, and/or 4A-4H. The semiconductor device 500 may include one or more additional devices, structures, and/or layers not shown in FIG. 5. For example, the semiconductor device 500 may include additional layers and/or dies formed on layers above and/or below the portion of the semiconductor device 500 shown in FIG. 5. Additionally, or alternatively, one or more additional semiconductor structures and/or semiconductor devices may be formed in a same layer of an electronic device that includes the semiconductor device, with a lateral displacement, as the semiconductor device 500 shown in FIG. 5. The semiconductor device 500 may be used in a FinFET structure having a narrow critical dimension (e.g., a lateral dimension as shown in FIG. 5), such as an N3 FinFET structure and/or a GAA FET structure. In some aspects, the semiconductor device 500 may include the semiconductor device 200 as shown in FIGS. 2A-2F, the semiconductor device 300 as shown in FIGS. 3A-3I, and/or the semiconductor device 400 shown in FIGS. 4A-4H.

As shown in FIG. 5, the semiconductor device 500 includes a substrate 502. The substrate 502 may include a semiconductor die substrate, a semiconductor wafer, or another type of substrate in and/or on which semiconductor devices may be formed. In some implementations, the substrate 502 is formed of silicon, a material including silicon, a III-V compound semiconductor material such as gallium arsenide, a silicon on insulator, or another type of semiconductor material.

The semiconductor device 500 includes a set of channels 504 extending between source/drains 506 through metal gate structures 508. The set of channels 504 include silicon-based nanostructures (e.g., nanosheets or nanowires, among other examples) such as the set of silicon germanium layers 204 or the set of silicon layers 206 described in connection with FIGS. 2A-2F, FIGS. 3A-3I, and/or FIGS. 4A-4H. The source/drains 506 may be formed using a manufacturing process described herein, such as those described in connection with FIGS. 2A-2F, FIGS. 3A-3I, and/or FIGS. 4A-4H having a buffer layer 216 positioned between the source/drains 506 and the substrate 502. The metal gate structures 508 may be formed of one or more metal materials, such as a work function metal and a fill metal. The work function metal and/or the fill metal may include, for example, a titanium-based material, a tungsten-based material, and/or a tantalum-based material. In some implementations, the metal gate structures may be formed around the set of channels 504 after removing a sacrificial structure (e.g., a dummy gate) as shown in FIG. 4H.

The semiconductor device 500 may also include one or more dielectric structures. For example, the semiconductor device 500 may include a trench isolation structure 510 that includes dielectric materials to provide electrical isolation and/or insulation between a fin shown in FIG. 5 and an adjacent fin. The semiconductor device 500 may also include an inter-layer dielectric 512 to provide electrical isolation and/or insulation between metal gate structures 508 and/or source/drains 506, among other examples.

As indicated above, FIG. 5 is provided as an example. Other examples may differ from what is described with regard to FIG. 5. The number and arrangement of devices, layers, and/or materials shown in FIG. 5 are provided as an example. In practice, there may be additional devices, layers, and/or materials, fewer devices, layers, and/or materials, different devices, layers, and/or materials, or differently arranged devices, layers, and/or materials than those shown in FIG. 5.

Figure 6:
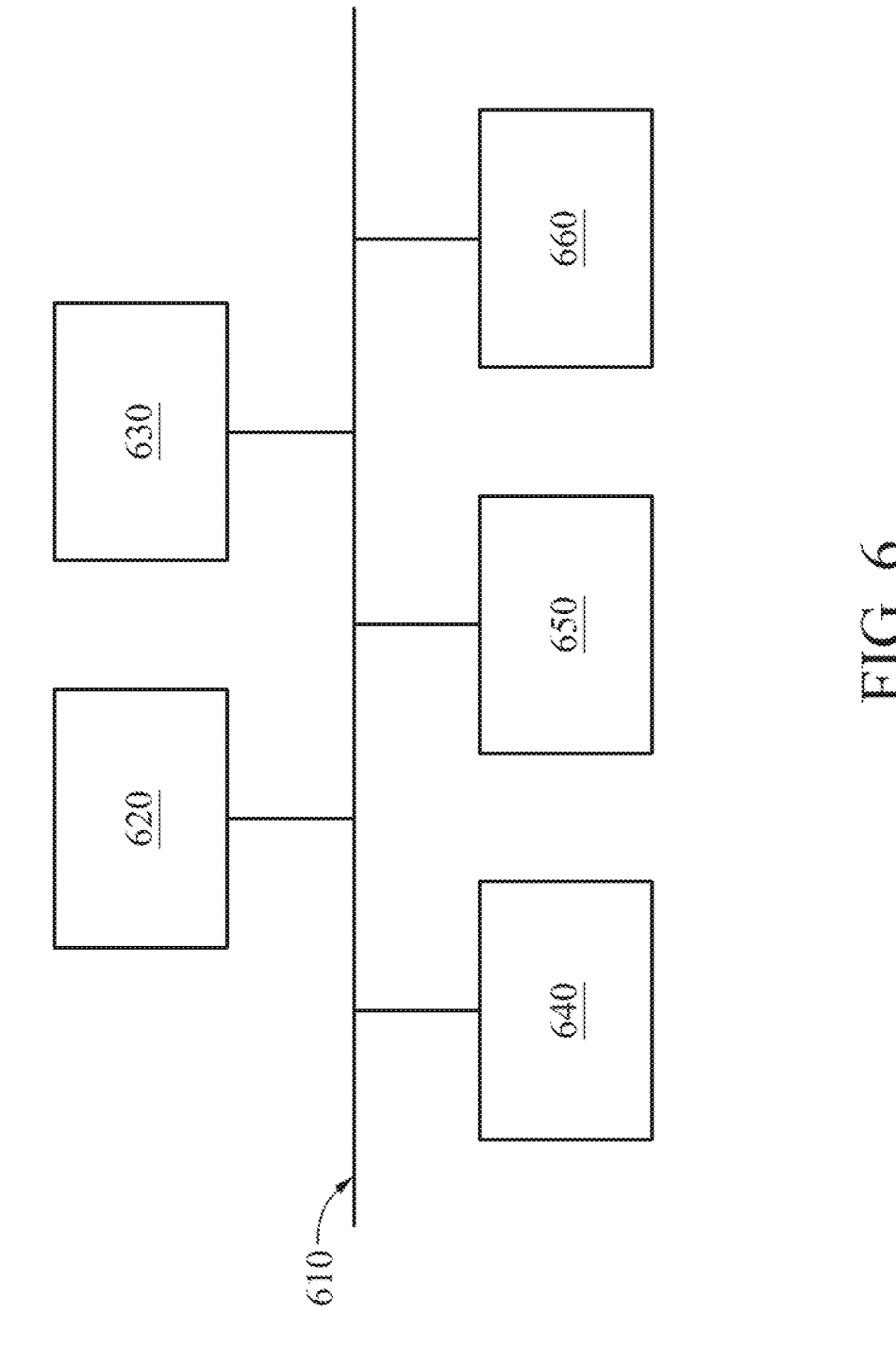
FIG. 6 is a diagram of example components of one or more devices of FIG. 1 described herein.

FIG. 6 is a diagram of example components of a device 600, which may correspond to deposition tool 102, etching tool 104, planarization tool 106, ion implantation tool 108, and/or wafer/die transport tool 110. In some implementations, deposition tool 102, etching tool 104, planarization tool 106, ion implantation tool 108, and/or wafer/die transport tool 110 may include one or more devices 600 and/or one or more components of device 600. As shown in FIG. 6, device 600 may include a bus 610, a processor 620, a memory 630, an input component 640, an output component 650, and a communication component 660.

Bus 610 includes one or more components that enable wired and/or wireless communication among the components of device 600. Bus 610 may couple together two or more components of FIG. 6, such as via operative coupling, communicative coupling, electronic coupling, and/or electric coupling. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform one or more operations or processes described elsewhere herein.

Memory 630 includes volatile and/or nonvolatile memory. For example, memory 630 may include random access memory (RAM), read only memory (ROM), a hard disk drive, and/or another type of memory (e.g., a flash memory, a magnetic memory, and/or an optical memory). Memory 630 may include internal memory (e.g., RAM, ROM, or a hard disk drive) and/or removable memory (e.g., removable via a universal serial bus connection). Memory 630 may be a non-transitory computer-readable medium. Memory 630 stores information, instructions, and/or software (e.g., one or more software applications) related to the operation of device 600. In some implementations, memory 630 includes one or more memories that are coupled to one or more processors (e.g., processor 620), such as via bus 610.

Input component 640 enables device 600 to receive input, such as user input and/or sensed input. For example, input component 640 may include a touch screen, a keyboard, a keypad, a mouse, a button, a microphone, a switch, a sensor, a global positioning system sensor, an accelerometer, a gyroscope, and/or an actuator. Output component 650 enables device 600 to provide output, such as via a display, a speaker, and/or a light-emitting diode. Communication component 660 enables device 600 to communicate with other devices via a wired connection and/or a wireless connection. For example, communication component 660 may include a receiver, a transmitter, a transceiver, a modem, a network interface card, and/or an antenna.

Device 600 may perform one or more operations or processes described herein. For example, a non-transitory computer-readable medium (e.g., memory 630) may store a set of instructions (e.g., one or more instructions or code) for execution by processor 620. Processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry may be used instead of or in combination with the instructions to perform one or more operations or processes described herein. Additionally, or alternatively, processor 620 may be configured to perform one or more operations or processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

FIG. 7 is a flowchart of an example process 700 relating to forming a semiconductor device described herein. In some implementations, one or more process blocks of FIG. 7 may be performed by a one or more semiconductor processing tools (e.g., deposition tool 102, etching tool 104, planarization tool 106, ion implantation tool 108, and/or wafer/die transport tool 110). Additionally, or alternatively, one or more process blocks of FIG. 7 may be performed by one or more components of device 600, such as processor 620, memory 630, input component 640, output component 650, and/or communication component 660.

As shown in FIG. 7, process 700 may include forming, in a nanostructure transistor device, a recessed portion for a source/drain region of the nanostructure transistor device (block 710). For example, the one or more semiconductor processing tools may form, in a nanostructure transistor device 200, a recessed portion for a source/drain region of the nanostructure transistor device 200, as described above.

As further shown in FIG. 7, process 700 may include forming an inner spacer on a bottom of the recessed portion and on sidewalls of the recessed portion (block 720). For example, the one or more semiconductor processing tools may form an inner spacer 214 on a bottom of the recessed portion and on sidewalls of the recessed portion, as described above.

As further shown in FIG. 7, process 700 may include etching the inner spacer such that the inner spacer is removed from the bottom and from first portions of the sidewalls, and such that the inner spacer remains on second portions of the sidewalls (block 730). For example, the one or more semiconductor processing tools may etch the inner spacer 214 such that the inner spacer 214 is removed from the bottom and from first portions of the sidewalls, and such that the inner spacer remains on second portions of the sidewalls, as described above.

As further shown in FIG. 7, process 700 may include forming, after etching the inner spacer, a buffer layer over a substrate of the nanostructure transistor device at the bottom of the recessed portion (block 740). For example, the one or more semiconductor processing tools may form, after etching the inner spacer 214, a buffer layer 216 over a substrate 202 of the nanostructure transistor device 200 at the bottom of the recessed portion, as described above.

As further shown in FIG. 7, process 700 may include forming the source/drain region over the buffer layer in the recessed portion (block 750). For example, the one or more semiconductor processing tools may form the source/drain region over the buffer layer 216 in the recessed portion, as described above.

Process 700 may include additional implementations, such as any single implementation or any combination of implementations described below and/or in connection with one or more other processes described elsewhere herein.

In a first implementation, forming the recessed portion comprises etching a plurality of layers of the nanostructure transistor device 200 in the recessed portion while the nanostructure transistor device 200 is under at least a partial vacuum, and wherein forming the buffer layer 216 comprises forming the buffer layer 216 after breaking the at least the partial vacuum such that the buffer layer 216 is formed in an ex-situ deposition operation.

In a second implementation, alone or in combination with the first implementation, forming the buffer layer 216 comprises forming the buffer layer 216 by a selective growth and etching technique such that the buffer layer grows on the bottom of the recessed portion.

In a third implementation, alone or in combination with one or more of the first and second implementations, the buffer layer 216 comprises un-doped silicon, or un-doped silicon germanium.

In a fourth implementation, alone or in combination with one or more of the first through third implementations, forming the buffer layer 216 comprises forming the buffer layer 216 such that a top surface of the buffer layer 216 is lower than a lowest silicon germanium nanostructure 204 of the nanostructure transistor device 200.

In a fifth implementation, alone or in combination with one or more of the first through fourth implementations, process 700 includes performing a selective growth and etching technique to form boron doped silicon regions 218 on silicon nanostructures 206 in the recessed portion and over a top surface of the buffer layer 216 in the recessed portion, wherein forming the source/drain region comprises forming the source/drain region over the boron doped silicon regions 218.

In a sixth implementation, alone or in combination with one or more of the first through fifth implementations, process 700 includes depositing intermediate filler regions 220 on the boron doped silicon regions 218 on sidewalls of the recessed portion and over a top surface of boron doped silicon regions 218 on the bottom of the recessed portion.

In a seventh implementation, alone or in combination with one or more of the first through sixth implementations, process 700 includes depositing epitaxial material 222 on the intermediate filler regions 220 in the recessed portion.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
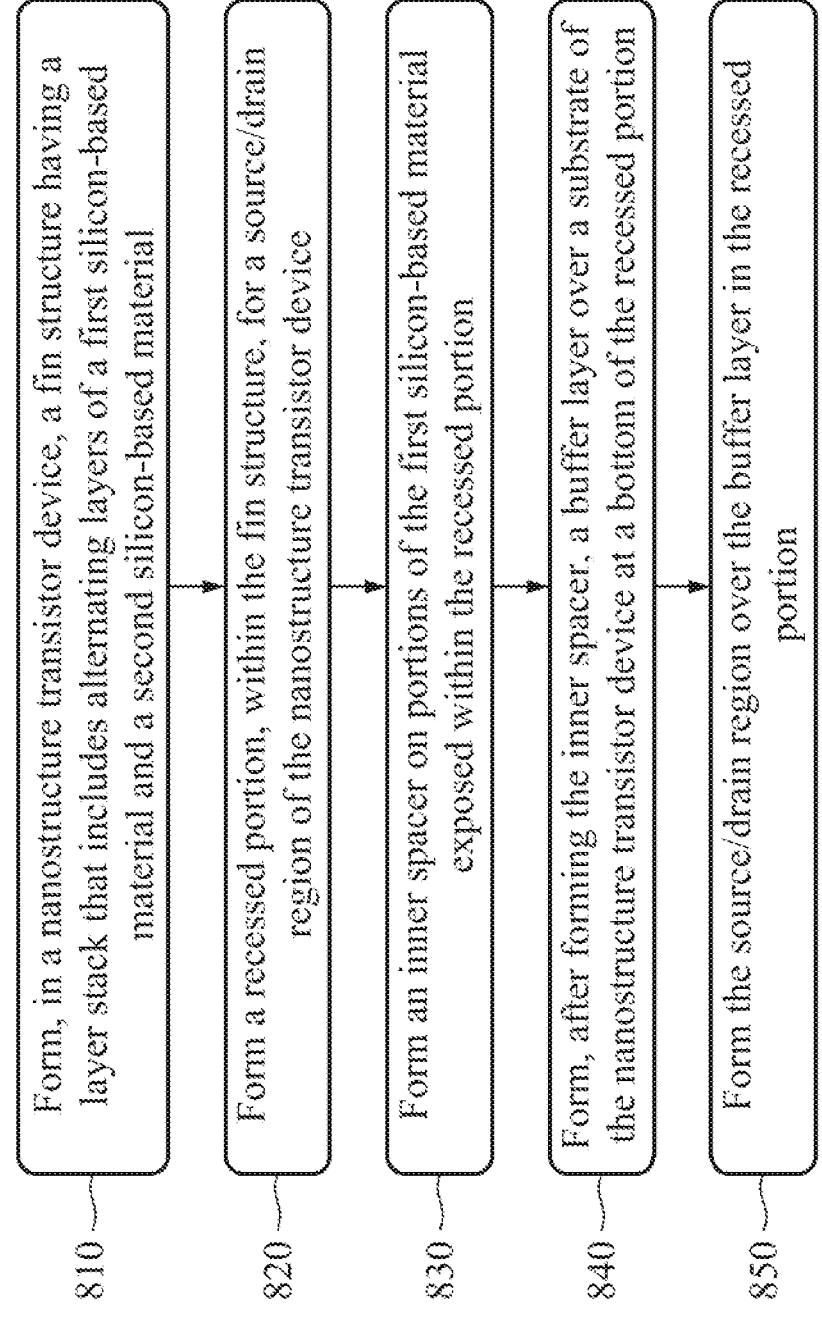

FIG. 8 is a flowchart of an example process 800 relating to forming a semiconductor device described herein. In some implementations, one or more process blocks of FIG. 8 may be performed by a one or more semiconductor processing tools (e.g., deposition tool 102, etching tool 104, planarization tool 106, ion implantation tool 108, and/or wafer/die transport tool 110). Additionally, or alternatively, one or more process blocks of FIG. 8 may be performed by one or more components of device 600, such as processor 620, memory 630, input component 640, output component 650, and/or communication component 660.

As shown in FIG. 8, process 800 may include forming, in a nanostructure transistor device, a fin structure having a fin stack that includes alternating layers of a first silicon-based material and a second silicon-based material (block 810). For example, the one or more semiconductor processing tools may form, in a nanostructure transistor device 200, a fin structure having a fin stack that includes alternating layers of a first silicon-based layer 204 and a second silicon-based layer 206, as described above.

As further shown in FIG. 8, process 800 may include forming a recessed portion, within the fin structure, for a source/drain region of the nanostructure transistor device (block 820). For example, the one or more semiconductor processing tools may form a recessed portion, within the fin structure, for a source/drain region of the nanostructure transistor device 200, as described above.

As further shown in FIG. 8, process 800 may include forming an inner spacer on portions of the first silicon-based material exposed within the recessed portion (block 830). For example, the one or more semiconductor processing tools may form an inner spacer 214 on portions of the first silicon-based layer 204 exposed within the recessed portion, as described above.

As further shown in FIG. 8, process 800 may include forming, after forming the inner spacer, a buffer layer over a substrate of the nanostructure transistor device at a bottom of the recessed portion (block 840). For example, the one or more semiconductor processing tools may form, after forming the inner spacer 214, a buffer layer 216 over a substrate 202 of the nanostructure transistor device 200 at a bottom of the recessed portion, as described above.

As further shown in FIG. 8, process 800 may include forming the source/drain region over the buffer layer in the recessed portion (block 850). For example, the one or more semiconductor processing tools may form the source/drain region over the buffer layer 216 in the recessed portion, as described above.

Process 800 may include additional implementations, such as any single implementation or any combination of implementations described below and/or in connection with one or more other processes described elsewhere herein.

In a first implementation, process 800 includes forming a first source/drain material (218) on portions of the second silicon-based layer 206 exposed within the recessed portion.

In a second implementation, alone or in combination with the first implementation, process 800 includes forming a second source/drain material 220 on the first source/drain material 218, and forming a third source/drain material 222 on the second source/drain material 220.

In a third implementation, alone or in combination with one or more of the first and second implementations, the third source/drain material 222 has a dopant concentration that is greater than a dopant concentration of the first source/drain material 218 and a dopant concentration of the second source/drain material 220.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

Based on depositing the source/drain region using multiple deposition operations, as described herein, the source/drain region has a reduced likelihood of forming voids within the source/drain region. Based on having the reduced likelihood of forming voids within the source/drain region, a resistance within the source/drain region may be reduced, which may reduce an amount of voltage required to operate using the source/drain region and/or reduce a likelihood of the source/drain region failing.

As described in greater detail above, some implementations described herein provide a method. The method includes forming, in a nanostructure transistor device, a recessed portion for a source/drain region of the nanostructure transistor device. The method includes forming an inner spacer on a bottom of the recessed portion and on sidewalls of the recessed portion. The method includes etching the inner spacer such that the inner spacer is removed from the bottom and from first portions of the sidewalls, and such that the inner spacer remains on second portions of the sidewalls. The method includes forming, after etching the inner spacer, a buffer layer at the bottom of the recessed portion. The method includes forming the source/drain region over the buffer layer in the recessed portion.

As described in greater detail above, some implementations described herein provide a nanostructure transistor device. The nanostructure transistor device includes a substrate. The nanostructure transistor device includes a plurality of fin structures, each comprising a plurality of silicon layers disposed over the substrate, wherein the plurality of silicon layers are arranged along a direction perpendicular to the substrate. The nanostructure transistor device includes a gate structure wrapping around each of the plurality of silicon layers. The nanostructure transistor device includes a buffer layer on the substrate between the plurality of fin structures. The nanostructure transistor device includes a source/drain region over the buffer layer between the plurality of fin structures.

As described in greater detail above, some implementations described herein provide a method. The method includes forming, in a nanostructure transistor device, a fin structure having a fin stack that includes alternating layers of a first silicon-based material and a second silicon-based material. The method includes forming a recessed portion, within the fin structure, for a source/drain region of the nanostructure transistor device. The method includes forming an inner spacer on portions of the first silicon-based material exposed within the recessed portion. The method includes forming, after forming the inner spacer, a buffer layer over a substrate of the nanostructure transistor device at a bottom of the recessed portion. The method includes forming the source/drain region over the buffer layer in the recessed portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming, in a nanostructure transistor device, a recessed portion for a source/drain region of the nanostructure transistor device, wherein the recessed portion comprises sidewalls comprising first portions and second portions alternating with the first portions, and wherein the recessed portion extends into a substrate;
   forming an inner spacer on the second portions of the sidewalls;
   forming, after forming the inner spacer, a buffer layer at a bottom of the recessed portion, wherein a top surface of the buffer layer extends downward from a top surface of the substrate, wherein a center of the top surface of the buffer layer is lower than a bottom surface of a bottom most sidewall of the sidewalls; and
   forming the source/drain region over the buffer layer in the recessed portion.

2. The method of claim 1,
   wherein forming the recessed portion comprises:
      etching a plurality of layers of the nanostructure transistor device in the recessed portion while the nanostructure transistor device is under at least a partial vacuum; and
   wherein forming the buffer layer comprises:
      forming the buffer layer after breaking the at least the partial vacuum such that the buffer layer is formed in an ex-situ deposition operation.

3. The method of claim 1,
   wherein forming the buffer layer comprises:
      forming the buffer layer by a selective growth and etching technique such that the buffer layer grows on the bottom of the recessed portion.

4. The method of claim 1,
   wherein the buffer layer comprises:
      un-doped silicon, or
      un-doped silicon germanium.

5. The method of claim 1,
   wherein forming the source/drain region comprises:
      performing a selective growth and etching technique to form boron doped silicon regions on silicon nano-structures in the recessed portion and over the top surface of the buffer layer in the recessed portion.

6. The method of claim 5, further comprising:
   depositing intermediate filler regions on the boron doped silicon regions on the sidewalls of the recessed portion and over a top surface of the boron doped silicon regions on the bottom of the recessed portion.

7. The method of claim 6, further comprising:
   depositing epitaxial material on the intermediate filler regions in the recessed portion.

8. A method, comprising:
   forming, in a nanostructure transistor device, a fin structure having a fin stack that includes alternating layers of a first silicon-based material and a second silicon-based material;
   forming a recessed portion, within the fin structure and into a substrate, for a source/drain region of the nanostructure transistor device;
   forming an inner spacer on portions of the first silicon-based material exposed within the recessed portion;
   forming, after forming the inner spacer, a buffer layer over the substrate at a bottom of the recessed portion, wherein a top surface of the buffer layer extends downward from a top surface of the substrate and has a curved surface; and
   forming the source/drain region over the buffer layer in the recessed portion.

9. The method of claim 8, further comprising:
   forming a first source/drain material on portions of the second silicon-based material exposed within the recessed portion.

10. The method of claim 9, further comprising:
   forming a second source/drain material on the first source/drain material; and
   forming a third source/drain material on the second source/drain material.

11. The method of claim 10,
   wherein the third source/drain material has a dopant concentration that is greater than a dopant concentration of the first source/drain material and a dopant concentration of the second source/drain material.

12. The method of claim 8,
   wherein an entirety of the top surface of the buffer layer is at or below a bottom surface of the fin stack.

13. A method, comprising:

forming a plurality of fin structures that each comprises a plurality of silicon layers, disposed over a substrate, and arranged along a direction perpendicular to the substrate;

forming a gate structure wrapping around each of the plurality of silicon layers;

forming a buffer layer in a recessed portion of the substrate between the plurality of fin structures, wherein the buffer layer extends from a surface of the substrate, and wherein an entirety of a top surface of the buffer layer resides at or below a bottom surface a bottom most fin structure of the plurality of the fin structures; and forming a source/drain region over the buffer layer between the plurality of fin structures.

14. The method of claim 13, wherein the buffer layer comprises:

un-doped silicon, or un-doped silicon germanium.

15. The method of claim 13, further comprising:

forming a boron-doped silicon germanium layer on:

sidewalls of silicon layers, of a first fin stack of a first fin structure of the plurality of fin structures, adjacent to the source/drain region, and sidewalls of silicon layers, of a second fin stack of a second fin structure of the plurality of fin structures, adjacent to the source/drain region.

16. The method of claim 13, further comprising:

forming a first set of inner spacers extending between layers of the plurality of silicon layers along a first sidewall of the source/drain region; and forming a second set of inner spacers extending between layers of the plurality of silicon layers along a second sidewall of the source/drain region.

17. The method of claim 16, wherein forming the source/drain region comprises:

forming a first layer on silicon layers and over the buffer layer;

forming a second layer on the first layer; and forming a third layer on the second layer.

18. The method of claim 17, wherein the source/drain region extends between a first fin structure of the plurality of fin structures and a second fin structure of the plurality of fin structures.

19. The method of claim 17, further comprising forming a capping layer on a top surface of the third layer.

20. The method of claim 17, wherein the third layer comprises:

a boron-doped silicon germanium layer, or a phosphorous-doped silicon layer.

* * * * *